(12) United States Patent
Okabayashi et al.

(10) Patent No.: US 7,536,289 B2
(45) Date of Patent: May 19, 2009

(54) METHOD OF CONFIGURING INFORMATION PROCESSING SYSTEM AND SEMICONDUCTOR INTEGRATED CIRCUIT

(75) Inventors: Kazuhiro Okabayashi, Osaka (JP); Minoru Okamoto, Osaka (JP)

(73) Assignee: Panasonic Corporation, Osaka (JP)

( * ) Notice: Subject to any disclaimer, the term of this patent is extended or adjusted under 35 U.S.C. 154(b) by 709 days.

(21) Appl. No.: 11/071,465

(22) Filed: Mar. 4, 2005

(65) Prior Publication Data

US 2005/0204326 A1    Sep. 15, 2005

(30) Foreign Application Priority Data

Mar. 11, 2004   (JP)   ............. P2004-068882

(51) Int. Cl.
*G06F 17/50*    (2006.01)
(52) U.S. Cl. ............. 703/15; 703/14; 716/10; 716/17
(58) Field of Classification Search ............. 703/13–22; 716/16, 10, 11, 17
See application file for complete search history.

(56) References Cited

U.S. PATENT DOCUMENTS 6,230,307 B1    5/2001   Davis et al.

OTHER PUBLICATIONS

Thornton et al., M.A. Tradeoff Analysis of Integer Multiplier Circuits Implemented in FPGAs, IEEE Pacific Rim Conference on Communications, Computers and Signal Processing, Aug. 1999, pp. 301-304.*

Eighamery et al., N.A. An Efficient FPGA Implementation of a Wavelet Coder/Decoder, IEEE, Proceedings of the 12th International Conference on Microelectronics, Nov. 2000, pp. 269-272.*

* cited by examiner

*Primary Examiner*—Russell Frejd
(74) *Attorney, Agent, or Firm*—McDermott Will & Emery LLP

(57) ABSTRACT

A method of configuring an information processing system according to the present invention, in an information processing system for realizing one or a plurality of applications, comprises, a step of modeling all of the applications for each certain process level and inputting the models, a step of inputting parameters representing invariability for the inputted models, a step of using the models of the applications and the parameters representing invariability as inputted information and comparing the parameters representing invariability to a boundary condition, and a step of allocating one of the application models to programmable logic and another of the application models to an exclusive-use hardware based on a result of the comparison.

22 Claims, 38 Drawing Sheets

FIG. 15

| module | continuity parameter | data-dependency parameter | weight of continuity | weight of data-dependency | calculation result | allocation result |
|---|---|---|---|---|---|---|
| 401 | 1 | 3 | 0.8 | 0.2 | 1.4 | exclusive-use HW |
| 402 | 2 | 2 | 0.8 | 0.2 | 2 | exclusive-use HW |
| 403 | 8 | 10 | 0.8 | 0.2 | 8.4 | programmable logic |
| 404 | 4 | 6 | 0.8 | 0.2 | 4.4 | exclusive-use HW |
| 405 | 10 | 7 | 0.8 | 0.2 | 9.4 | programmable logic |

F I G. 16
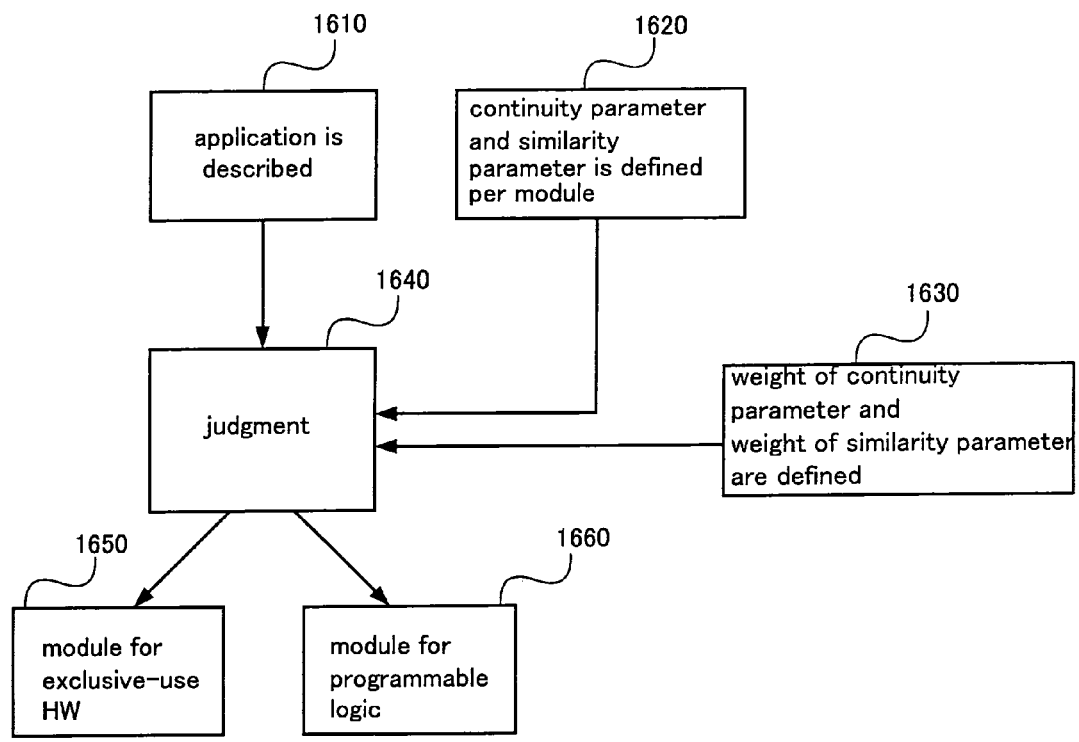

FIG. 19

| module | continuity parameter | similarity parameter | weight of continuity | weight of similarity | calculation result | allocation result |
|---|---|---|---|---|---|---|
| 1001 | 1 | 1 | 0.6 | 0.4 | 0.2 | programmable logic |
| 1002 | 2 | 2 | 0.6 | 0.4 | 0.4 | programmable logic |
| 1003 | 8 | 8 | 0.6 | 0.4 | 1.6 | programmable logic |
| 1004 | 4 | 4 | 0.6 | 0.4 | 0.8 | programmable logic |
| 1005 | 10 | 10 | 0.6 | 0.4 | 2 | programmable logic |
| 1011 | 1 | 3 | 0.6 | 0.4 | -0.6 | exclusive-use HW |
| 1012 | 2 | 3 | 0.6 | 0.4 | 0 | exclusive-use HW |
| 1013 | 8 | 2 | 0.6 | 0.4 | 4 | programmable logic |
| 1014 | 1 | 2 | 0.6 | 0.4 | -0.2 | exclusive-use HW |
| 1015 | 7 | 8 | 0.6 | 0.4 | 1 | programmable logic |
| 1016 | 3 | 4 | 0.6 | 0.4 | 0.2 | programmable logic |
| 1017 | 8 | 10 | 0.6 | 0.4 | 0.8 | programmable logic |

F I G. 20
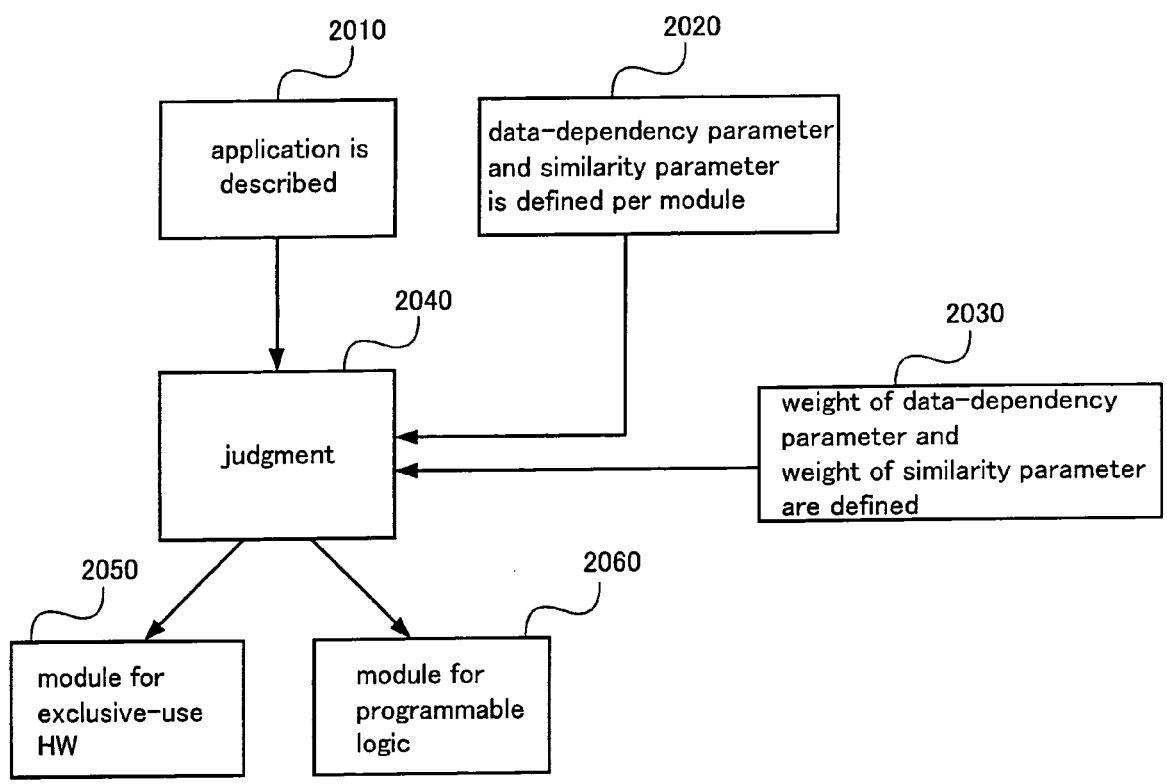

F I G. 23

| module | data-dependency parameter | similarity parameter | weight of data-dependency | weight of similarity | calculation result | allocation result |
|---|---|---|---|---|---|---|
| 1001 | 1 | 1 | 1 | 1 | 0 | exclusive-use HW |
| 1002 | 2 | 2 | 1 | 1 | 0 | exclusive-use HW |
| 1003 | 7 | 8 | 1 | 1 | -1 | exclusive-use HW |
| 1004 | 5 | 4 | 1 | 1 | 1 | programmable logic |
| 1005 | 8 | 10 | 1 | 1 | -2 | exclusive-use HW |
| 1011 | 4 | 3 | 1 | 1 | 1 | programmable logic |
| 1012 | 2 | 3 | 1 | 1 | -1 | exclusive-use HW |
| 1013 | 3 | 2 | 1 | 1 | 1 | programmable logic |
| 1014 | 1 | 2 | 1 | 1 | -1 | exclusive-use HW |
| 1015 | 10 | 8 | 1 | 1 | 2 | programmable logic |
| 1016 | 8 | 4 | 1 | 1 | 4 | programmable logic |
| 1017 | 7 | 10 | 1 | 1 | -3 | exclusive-use HW |

F I G. 27

| module | continuity parameter | data-dependency parameter | similarity parameter | weight of continuity | weight of data-dependency | weight of similarity | calculation result | allocation result |
|---|---|---|---|---|---|---|---|---|
| 1001 | 1 | 1 | 1 | 2 | 1 | 2 | 1 | programmable logic |
| 1002 | 2 | 2 | 2 | 2 | 1 | 2 | 2 | programmable logic |
| 1003 | 8 | 7 | 8 | 2 | 1 | 2 | 7 | programmable logic |
| 1004 | 4 | 5 | 4 | 2 | 1 | 2 | 5 | programmable logic |
| 1005 | 10 | 8 | 10 | 2 | 1 | 2 | 8 | programmable logic |
| 1011 | 1 | 4 | 3 | 2 | 1 | 2 | 0 | exclusive-use HW |
| 1012 | 2 | 2 | 3 | 2 | 1 | 2 | 0 | exclusive-use HW |
| 1013 | 8 | 3 | 2 | 2 | 1 | 2 | 15 | programmable logic |
| 1014 | 1 | 1 | 2 | 2 | 1 | 2 | -1 | exclusive-use HW |
| 1015 | 7 | 10 | 8 | 2 | 1 | 2 | 8 | programmable logic |
| 1016 | 3 | 8 | 4 | 2 | 1 | 2 | 6 | programmable logic |
| 1017 | 8 | 7 | 10 | 2 | 1 | 2 | 3 | programmable logic |

FIG. 32

| module | continuity parameter | result |
|---|---|---|
| 1001 | 1 | step 2831 |
| 1002 | 2 | step 2831 |
| 1003 | 4 | step 2831 |
| 1004 | 4 | step 2831 |
| 1005 | 10 | programmable logic |
| 1011 | 1 | step 2831 |
| 1012 | 2 | step 2831 |
| 1013 | 8 | programmable logic |
| 1014 | 1 | step 2831 |
| 1015 | 4 | step 2831 |
| 1016 | 3 | step 2831 |
| 1017 | 8 | programmable logic |

FIG. 33

| module | data-dependency parameter | result |
|---|---|---|
| 1001 | 1 | step 2832 |
| 1002 | 2 | step 2832 |
| 1003 | 7 | programmable logic |
| 1004 | 4 | step 2832 |
| 1011 | 4 | step 2832 |
| 1012 | 2 | step 2832 |
| 1014 | 1 | step 2832 |
| 1015 | 10 | programmable logic |
| 1016 | 3 | step 2832 |

FIG. 34

| module | similarity parameter | result |
|---|---|---|
| 1001 | 1 | programmable logic |
| 1002 | 2 | programmable logic |
| 1004 | 10 | exclusive-use HW |
| 1011 | 3 | programmable logic |
| 1012 | 3 | programmable logic |
| 1014 | 2 | programmable logic |
| 1016 | 10 | exclusive-use HW |

FIG. 36A

```
void applicationA( void )
{
        :
        :
    a1001(); /* ETNL =  2, DATA =1, COMMON=8 */
    a1002(); /* ETNL =  1, DATA =1, COMMON=4 */
    a1003(); /* ETNL =  2, DATA =4, COMMON=1 */
    a1004(); /* ETNL =  3, DATA =6, COMMON=2 */
    a1005(); /* ETNL =  7, DATA =7, COMMON=3 */
        :
        :
}
```
3610

FIG. 36B

```
void applicationB( void )
{
        :
        :
    b1011(); /* ETNL =  2, DATA =1, COMMON=10 */
    b1012(); /* ETNL =  1, DATA =1, COMMON=7 */
    b1013(); /* ETNL =  2, DATA =4, COMMON=4 */
    b1014(); /* ETNL =  3, DATA =6, COMMON=2 */
    b1015(); /* ETNL =  4, DATA =1, COMMON=5 */
    b1016(); /* ETNL =  3, DATA =3, COMMON=3 */
    b1017(); /* ETNL =  7, DATA =2, COMMON=1 */
        :
        :
}
```
3620

FIG. 38

| module | continuity parameter | data-dependency parameter | similarity parameter | weight of continuity | weight of data-dependency | weight of similarity | calculation result | allocation result |
|---|---|---|---|---|---|---|---|---|
| 1001 | 2 | 1 | 8 | 2 | 1 | 2 | -11 | exclusive-use HW |
| 1002 | 1 | 1 | 4 | 2 | 1 | 2 | -5 | exclusive-use HW |
| 1003 | 2 | 4 | 1 | 2 | 1 | 2 | 6 | programmable logic |
| 1004 | 3 | 6 | 2 | 2 | 1 | 2 | 8 | programmable logic |
| 1005 | 7 | 7 | 3 | 2 | 1 | 2 | 15 | programmable logic |
| 1011 | 2 | 1 | 10 | 2 | 1 | 2 | -15 | exclusive-use HW |
| 1012 | 1 | 1 | 7 | 2 | 1 | 2 | -11 | exclusive-use HW |
| 1013 | 2 | 4 | 4 | 2 | 1 | 2 | 0 | programmable logic |
| 1014 | 3 | 6 | 2 | 2 | 1 | 2 | 8 | programmable logic |
| 1015 | 4 | 1 | 5 | 2 | 1 | 2 | -1 | exclusive-use HW |
| 1016 | 3 | 3 | 3 | 2 | 1 | 2 | 3 | programmable logic |
| 1017 | 7 | 2 | 1 | 2 | 1 | 2 | 14 | programmable logic |

FIG. 40A

```
                                                                          ~ 4010
module applicationA( clock, reset, ····· );
input clock ;
input reset;
      :
      :
a1        a1( .clock(clock), .reset(reset),.····);  /* ETNL =10, DATA=1 , COMMON =  1 */
a2        a2( .clock(clock), .reset(reset),.····);  /* ETNL = 1 ,DATA = 3 , COMMON = 1 */
a3        a3( .clock(clock), .reset(reset),.····);  /* ETNL = 1 , DATA = 1 ,COMMON = 10 */
      :
endmodule
```

FIG. 40B

```
                                                                          ~ 4020
module applicationB( clock, reset, ····· );
input clock ;
input reset;
      :
      :
b1        b1( .clock(clock), .reset(reset),.····);  /* ETNL = 5 , DATA = 3 , COMMON = 6*/
b2        b2( .clock(clock), .reset(reset),.····);  /* ETNL = 1 , DATA = 3 , COMMON = 5 */
b3        b3( .clock(clock), .reset(reset),.····);  /* ETNL = 2 , DATA = 1 , COMMON = 5 */
      :
endmodule
```

FIG. 40C

```
                                                                          ~ 4030
module applicationC( clock, reset, ····· );
input clock ;
input reset;
      :
      :
c1        c1( .clock(clock), .reset(reset),.····);  /* ETNL = 1 , DATA = 3 , COMMON = 3 */
c2        c2( .clock(clock), .reset(reset),.····);  /* ETNL = 2 , DATA = 3 , COMMON = 1 */
c3        c3( .clock(clock), .reset(reset),.····);  /* ETNL = 5 , DATA = 10 , COMMON = 10 */
      :
endmodule
```

FIG. 41

| module | continuity parameter | data-dependency parameter | similarity parameter | weight of continuity parameter | weight of data-dependency parameter | weight of similarity parameter | calculation result | result |
|---|---|---|---|---|---|---|---|---|
| a1 | 10 | 1 | 1 | 2 | 1 | 2 | 19 | programmable logic |
| a2 | 1 | 3 | 1 | 2 | 1 | 2 | 3 | programmable logic |
| a3 | 1 | 1 | 10 | 2 | 1 | 2 | -17 | exclusive-use HW |
| b1 | 5 | 3 | 6 | 2 | 1 | 2 | 1 | programmable logic |
| b2 | 1 | 3 | 5 | 2 | 1 | 2 | -5 | exclusive-use HW |
| b3 | 2 | 1 | 5 | 2 | 1 | 2 | -5 | exclusive-use HW |
| c1 | 1 | 3 | 3 | 2 | 1 | 2 | -1 | exclusive-use HW |
| c2 | 2 | 3 | 1 | 2 | 1 | 2 | 5 | programmable logic |
| c3 | 5 | 10 | 10 | 2 | 1 | 2 | 0 | programmable logic |

FIG. 43A

```
module applicationA( clock, reset, ...... );
input clock;
input reset;

a1(.clock(clock),.reset(reset),.....); /* ETNL = 10, DATA = 1 */
    a2(.clock(clock),.reset(reset),.....); /* ETNL = 1, DATA = 3 */
    a3(.a(a),.b(b),.c(c) );                /* ETNL = 1, DATA = 1 */ endmodule module a3(a,b,c);        ┐
input [3:0] a;           │
input [3:0] b;           ├── 4311
output [3:0] c;          │
                         │
assign c = a + b ;       │
                         ┘
endmodule
```
4310

FIG. 43B

```
module applicationB( clock, reset, ...... );
input clock;
input reset;

b1(.clock(clock),.reset(reset),.....); /* ETNL = 5, DATA = 3 */
    b2(.a(a),.b(b),.c(c) );                /* ETNL = 1, DATA = 1 */
    b3(.clock(clock),.reset(reset),.....); /* ETNL = 2, DATA = 1 */ endmodule module b2(a,b,c);        ┐
input [3:0] a;           │
input [3:0] b;           ├── 4321
output [3:0] c;          │
                         │
assign c = a + b ;       │
                         ┘
endmodule
```
4320

FIG. 43C

```
module applicationC( clock, reset, ...... );
input clock;
input reset;

c1(.a(a),.b(b),.c(c) );                /* ETNL = 2, DATA = 1 */
    c2(.clock(clock),.reset(reset),.....); /* ETNL = 5, DATA = 3 */
    c3(.clock(clock),.reset(reset),.....); /* ETNL = 2, DATA = 10 */ endmodule module c1(a,b,c);        ┐
input [3:0] a;           │
input [3:0] b;           ├── 4331
output [3:0] c;          │
                         │
assign c = a + b ;       │
                         ┘
endmodule
```
4330

FIG. 44

| module | continuity parameter | data-dependency parameter | extraction of similarity parameter | weight of continuity parameter | weight of data-dependency parameter | weight of similarity parameter | calculation result | result |
|---|---|---|---|---|---|---|---|---|
| a1 | 10 | 1 | 1 | 2 | 1 | 2 | 19 | programmable logic |
| a2 | 1 | 3 | 1 | 2 | 1 | 2 | 3 | programmable logic |
| a3 | 1 | 1 | 10 | 2 | 1 | 2 | -17 | exclusive-use HW |
| b1 | 5 | 3 | 1 | 2 | 1 | 2 | 11 | programmable logic |
| b2 | 1 | 3 | 1 | 2 | 1 | 2 | 3 | programmable logic |
| b3 | 2 | 1 | 10 | 2 | 1 | 2 | -15 | exclusive-use HW |
| c1 | 1 | 3 | 1 | 2 | 1 | 2 | 3 | programmable logic |
| c2 | 2 | 3 | 1 | 2 | 1 | 2 | 5 | programmable logic |
| c3 | 5 | 10 | 10 | 2 | 1 | 2 | 0 | programmable logic |

METHOD OF CONFIGURING INFORMATION PROCESSING SYSTEM AND SEMICONDUCTOR INTEGRATED CIRCUIT

BACKGROUND OF THE INVENTION

1. Field of the Invention

The present invention relates to an information processing system for realizing an application using programmable logic capable of reconfiguring a semiconductor integrated circuit after the semiconductor integrated circuit is manufactured, more particularly to a method of configuring the information processing system including the programmable logic, and further, to a semiconductor integrated circuit to which the method of configuring the information processing system is applied.

2. Description of the Related Art

In processing different kinds of digital signals, different kinds of semiconductor integrated circuits, examples of which are a microcomputer, DSP (Digital Signal Processor), ASIC (Application Specific Integrated Circuit), a memory element (memory) and the like, are used. In recent years, a programmable logic (such as microcomputer and DSP) capable of changing a process by means of a program after the semiconductor integrated circuit is manufactured, a programmable logic capable of unrestrainedly changing a configuration of the circuit after the circuit is manufactured and, in particular, a re-configurable logic capable of executing a shift of the circuit configuration at a high speed have been attracting attention.

In the re-configurable logic, in the case in which a technical standard or a specification is changed or a problem is generated in the semiconductor integrated circuit, the circuit configuration can be unrestrainedly changed, which does not require an additional manufacturing of the circuit. The application of the re-configurable logic can contribute to the reductions of a time length required for development and a manufacturing cost of the semiconductor integrated circuit.

As shown in FIGS. 1 and 2, providing that a part shared by all of a plurality of circuits and a part comprised of non-exclusive independent circuits in which no common part on the circuits is included and areas constituting the circuits do not overlap are collectively referred to as a preceding base circuit, a first step of previously configuring the preceding base circuit on a programmable logic circuit and a second step of partially reconfiguring the plurality of circuits based on circuit information representing a differential between the plurality of circuits and the preceding base circuit and thereby generating a necessary a functional circuit on the programmable logic circuit are repeated.

However, the programmable logic generally consumes a larger area and a larger volume of power in comparison to any exclusive-use hardware. In the case in which the sharable part on the circuits is small and there are many non-exclusive independent circuits, an area where the circuits can be freely shifted and used is quite limited. Therefore, an area-utilizing efficiency of the integrated circuit is poor and the circuit size is thereby increased, which unfavorably increases the manufacturing cost of the programmable logic circuit.

BRIEF SUMMARY OF THE INVENTION

A method of configuring an information processing system according to the present invention, in an information processing system for realizing one or a plurality of applications, comprises:

a step of modeling all of the applications for each certain process level and inputting the models;

a step of inputting parameters representing invariability for the inputted models;

a step of using the models of the applications and the parameters representing invariability as inputted information and comparing the parameters representing invariability to a boundary condition; and a step of outputting information that one of the application models is allocated to programmable logic and another of the application models is allocated to an exclusive-use hardware based on a result of the comparison.

A semiconductor integrated circuit corresponding to the foregoing method of configuring the information processing system is comprised of a circuit portion for realizing the process whose parameter representing invariability is low by means of the programmable logic and a circuit portion for realizing the process whose parameter representing invariability is high by means of the exclusive-use hardware.

According to the foregoing constitution, the parameter representing invariability corresponding to the relevant process is judged as an inputted condition for each module constituting the application, and the module whose parameter representing invariability is high demanding no change thereafter is allocated to the exclusive-use circuit. In such a manner, a circuit area of a minimum size can be realized. On the contrary, the module in which the parameter is low and the necessity of the change is high is allocated to the programmable logic (microcomputer, DSP, re-configurable LSI or the like). Accordingly, the change can be flexibly handled through rewriting the program. As a result, a manufacturing cost of the programmable logic can be curtailed as a result of reducing the circuit size and an increased efficiency of the area utilization thereby achieved.

Additional objects and advantages of the present invention will be apparent from the following detailed description of preferred embodiments thereof, which are best understood with reference to the accompanying drawings.

BRIEF DESCRIPTION OF THE DRAWINGS

FIG. 15 is a table showing a result of allocation per module obtained in the embodiment 4.

FIG. 16 is a flow chart illustrating a method of configuring an information processing system according to an embodiment 5 of the present invention.

FIG. 19 is a table showing a result of allocation per module obtained in the embodiment 5.

FIG. 20 is a flow chart illustrating a method of configuring an information processing system according to an embodiment 6 of the present invention.

FIG. 23 is a table showing a result of allocation per module obtained in the embodiment 6.

FIG. 27 is a table showing a result of allocation per module obtained in the embodiment 7.

FIG. 32 is a table showing a result of allocation per module of the continuity parameters obtained in the embodiment 8.

FIG. 33 is a table showing a result of allocation per module of the data-dependency parameters obtained in the embodiment 8.

FIG. 34 is a table showing a result of allocation per module of the similarity parameters obtained in the embodiment 8.

FIGS. 36A and 36B are block diagrams of files including respective continuity parameters, data-dependency parameters, and similarity parameters according to the embodiment 9.

FIG. 38 is a table showing a result of allocation per module obtained in the embodiment 9.

FIGS. 40A, 40B and 40C are block diagrams of files including respective continuity parameters, data-dependency parameters, and similarity parameters according to the embodiment 10.

FIG. 41 is a table showing a result of allocation per module obtained in the embodiment 10.

FIGS. 43A, 43B and 43C are block diagrams of files including respective continuity parameters and data-dependency parameters according to the embodiment 11.

FIG. 44 is a table showing a result of allocation per module obtained in the embodiment 11.

DETAILED DESCRIPTION OF THE PREFERRED EMBODIMENTS

Figure 1:
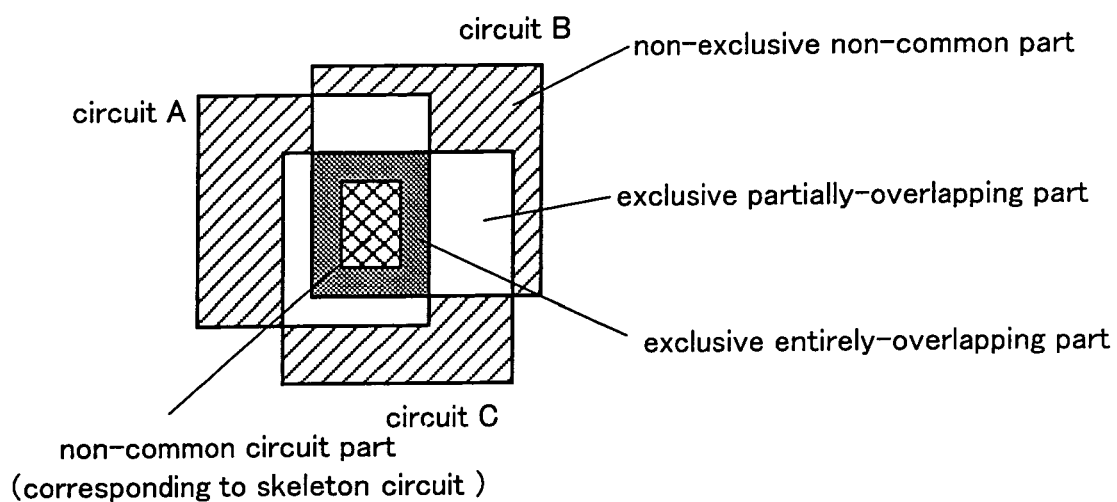
FIG. 1 is an illustration of a method of reconfiguring a programmable logic circuit according to a conventional technology.
Figure 2:
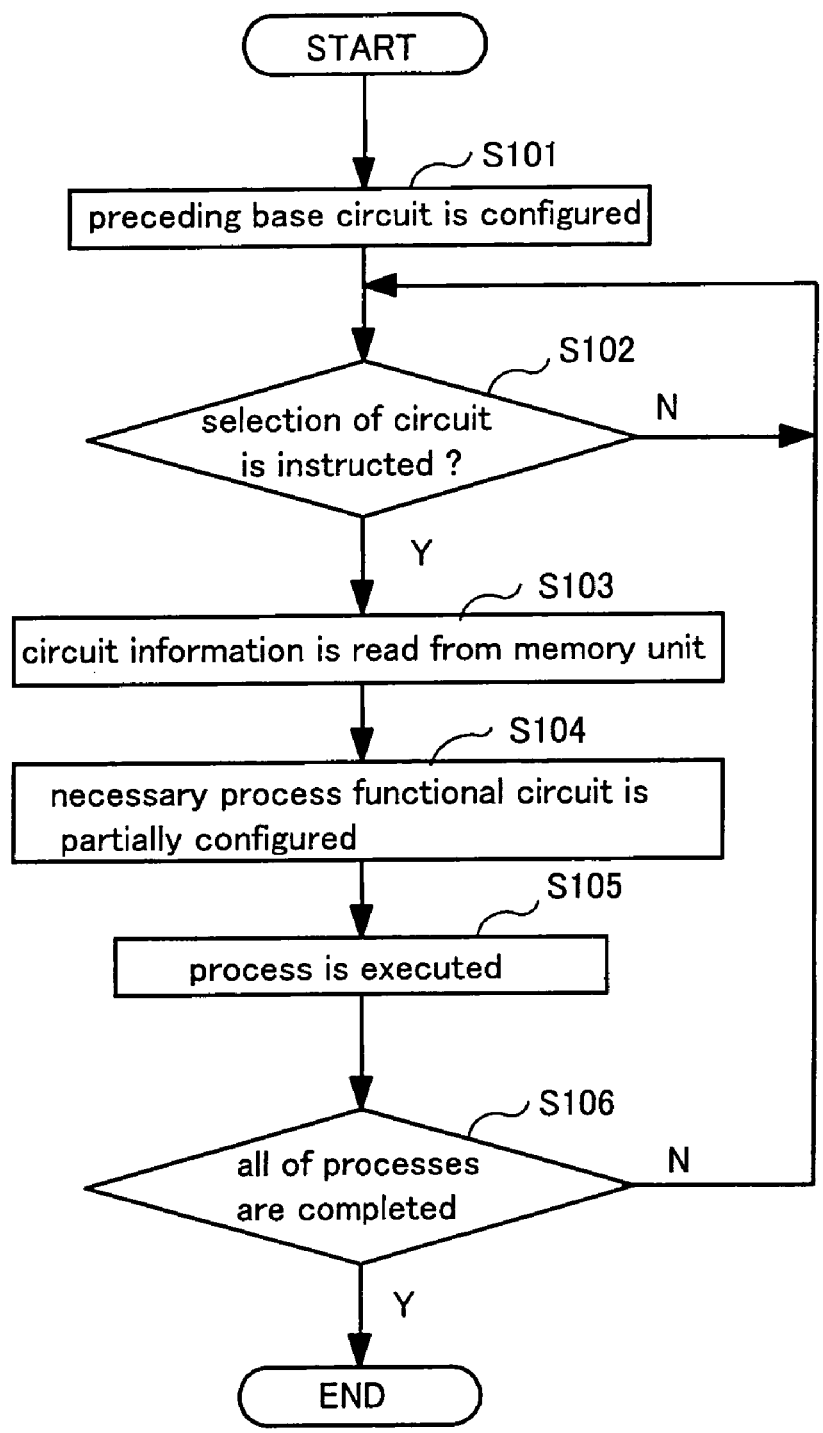
FIG. 2 is a flow chart illustrating an operation according to the conventional technology.

Referring to the before-mentioned method of configuring the information processing system according to the present invention, the parameter representing invariability ranges in variety, examples of which include a continuity parameter, a data-dependency parameter, a similarity parameter and the like and combinations thereof. The continuity parameter and the similarity parameter represent a same trend in terms of a magnitude correlation thereof, while they represent a reverse trend relative to the data-dependency parameter. Hereinafter, the present invention is more specifically described in different aspects.

A first method of configuring a first information processing system, in an information processing system for realizing one or a plurality of applications, comprises:

a step of modeling all of the applications for each certain process level and inputting the models;

a step of inputting continuity parameters for the inputted models;

a step of using the models of the applications and the continuity parameters as inputted information and comparing the continuity parameters to a boundary condition; and a step of outputting information that one of the application models is allocated to programmable logic and another of the application models is allocated to an exclusive-use hardware based on a result of the comparison.

The continuity parameter is an indicator which indicates if it is ever necessary to change the process or to often change the process in the future.

A semiconductor integrated circuit corresponding to the first method of configuring the information processing system is comprised of a circuit portion for realizing the process whose parameter of continuity is low by means of the programmable logic and a circuit portion for realizing the process whose parameter of continuity is high by means of the exclusive-use hardware.

According to the foregoing constitution, the continuity parameter corresponding to the relevant process is judged as an inputted condition for each module constituting the application, the module demanding no change thereafter based on the judgment is allocated to the exclusive-use circuit. In such a manner, a circuit area of a minimum size can be realized. On the contrary, the module whose necessity of the change is high is allocated to the programmable logic. Accordingly, the change can be flexibly handled through rewriting the program. As a result, the manufacturing cost of the programmable logic can be curtailed through the reduction of the circuit size and the efficiency of the area utilization thereby increased.

A second method of configuring an information processing system, in an information processing system for realizing one or a plurality of applications, comprises:

a step of modeling all of the applications for each certain process level and inputting the models;

a step of inputting data-dependency parameters for the inputted models;

a step of using the models of the applications and the data-dependency parameters as inputted information and comparing the data-dependency parameters to a boundary condition; and a step of outputting information that one of the application models is allocated to programmable logic and another of the application models is allocated to an exclusive-use hardware based on a result of the comparison.

The data-dependency parameter is an indicator which indicates if a volume of data to be processed is constant or varies.

A semiconductor integrated circuit corresponding to the second method of configuring the information processing system is comprised of a circuit portion for realizing the process whose data-dependency parameter is high by means of the programmable logic and a circuit portion for realizing the process whose data-dependency parameter is low by means of the exclusive-use hardware.

According to the foregoing constitution, the data-dependency parameter corresponding to the relevant process is judged as an inputted condition for each module constituting the application, the module whose volume of the data to be processed is constant is allocated to the exclusive-use circuit. In such a manner, a circuit consuming a small amount of power in a minimum area size can be realized. On the contrary, the module whose volume of the data to be processed is highly variable is allocated to the programmable logic. As a result of that, the change can be flexibly handled by optimizing the configuration of the programmable logic circuit through merely rewriting the program depending on the data volume. Any process including the data dependency is realized by means of the programmable logic, while any process including no data dependency is realized by means of the exclusive-use hardware so that the area of the semiconductor integrated circuit can be minimized and the manufacturing cost can be thereby curtailed. Further, a processing frequency can be reduced and the power consumption can be curtailed because the optimum circuit can be configured depending on the process.

A third method of configuring an information processing system, in an information processing system for realizing one or a plurality of applications, comprises:

a step of modeling all of the applications for each certain process level and inputting the models;

a step of inputting similarity parameters for the inputted models;

a step of using the models of the applications and the similarity parameters as inputted information and comparing the similarity parameters to a boundary condition; and a step of outputting information that one of the application models is allocated to programmable logic and another of the application models is allocated to an exclusive-use hardware based on a result of the comparison.

The similarity parameter is an indicator which indicates if there is any similar process among the modules.

A semiconductor integrated circuit corresponding to the third method of configuring the information processing system is comprised of a circuit portion for realizing the process whose similarity parameter is low by means of the programmable logic and a circuit portion for realizing the process whose similarity parameter is high by means of the exclusive-use hardware.

According to the foregoing constitution, the similarity parameter corresponding to the relevant process is judged as an inputted condition for each module constituting the application, the modules including the similar process are allocated to the exclusive-use circuit. In such a manner, the circuit reducing the power consumption and achieving a minimum area size can be realized. On the contrary, the modules in which the detected similarity is low are allocated to the programmable logic. As a result of that, a flexible response can be realized in changing the process by optimizing the configuration of the programmable logic circuit through merely rewriting the program. The sharable modules are realized by means of the exclusive-use circuit and the modules hardly sharable are realized by means of the programmable logic so that the area of the semiconductor integrated circuit can be minimized and the manufacturing cost can be thereby curtailed.

A fourth method of configuring an information processing system, in an information processing system for realizing one or a plurality of applications, comprises:

a step of modeling all of the applications for each certain process level and inputting the models;

a step of inputting continuity parameters and data-dependency parameters for the inputted models;

a step of weighting the respective continuity parameters and data-dependency parameters;

a step of comparing/selecting the models of the application, continuity parameters, data-dependency parameters and respective weights thereof as inputted information; and a step of outputting information that one of the application models is allocated to programmable logic and another of the application models is allocated to an exclusive-use hardware based on a result of the comparison.

According to the foregoing constitution, the continuity parameter and the data-dependency parameter for each module are judged as inputted conditions, the module demanding no change thereafter and having a low data dependency is allocated to the exclusive-use circuit. In such a manner, the circuit area can be minimized. On the contrary, the module whose necessity of the change is high and having a high data dependency is allocated to the programmable logic. The change can be thereby flexibly handled through rewriting the program. As a result, the programmable logic circuit can be downsized and a higher efficiency of the area utilization can be achieved, which results in the curtailment of the manufacturing cost.

A fifth method of configuring an information processing system, in an information processing system for realizing one or a plurality of applications, comprises:

a step of modeling all of the applications for each certain process level and inputting the models;

a step of inputting continuity parameters and similarity parameters for the inputted models;

a step of weighting the respective continuity parameters and similarity parameters;

a step of comparing/selecting the models of the applications, continuity parameters, similarity parameters and respective weights thereof as inputted information; and a step of outputting information that one of the application models is allocated to programmable logic and another of the application models is allocated to an exclusive-use hardware based on a result of the comparison.

According to the foregoing constitution, the continuity parameter and the similarity parameter for each module are judged as inputted conditions, the modules demanding no change thereafter and having a high similarity are allocated to the exclusive-use circuit. In such a manner, the circuit area can be minimized. On the contrary, the modules whose necessity of the change is high and having a low similarity are allocated to the programmable logic. The change can be thereby flexibly handled through rewriting the program. As a result, the programmable logic circuit can be downsized and the efficiency of the area utilization is increased, which result in the curtailment of the manufacturing cost.

A sixth method of configuring an information processing system, in an information processing system for realizing one or a plurality of applications, comprises:

a step of modeling all of the applications for each certain process level and inputting the models;

a step of inputting data-dependency parameters and similarity parameters for the inputted models;

a step of weighting the respective data-dependency parameters and similarity parameters;

a step of comparing/selecting the models of the applications, data-dependency parameters, similarity parameters and respective weights thereof as inputted information; and a step of outputting information that one of the application models is allocated to programmable logic and another of the application models is allocated to an exclusive-use hardware based on a result of the comparison.

According to the foregoing constitution, the data-dependency parameter and the similarity parameter corresponding to the relevant process are judged as inputted conditions, the modules in which the process does not depend on the data volume a high similarity is detected are allocated to the exclusive-use circuit. In such a manner, the circuit area can be minimized. On the contrary, the modules having a high data dependency and a low similarity are allocated to the programmable logic. The change can be thereby flexibly handled through rewriting the program. As a result, the programmable logic circuit can be downsized and the efficiency of the area utilization can be increased, which leads to the curtailment of the manufacturing cost.

A seventh method of configuring an information processing system, in an information processing system for realizing one or a plurality of applications, comprises:

a step of modeling all of the applications for each certain process level and inputting the models;

a step of inputting continuity parameters, data-dependency parameters and similarity parameters for the inputted models;

a step of weighting the respective continuity parameters, data-dependency parameters and similarity parameters;

a step of comparing/selecting the models of the applications, continuity parameters, data-dependency parameters, similarity parameters and respective weights thereof as inputted information; and a step of outputting information that one of the application models is allocated to programmable logic and another of the application models is allocated to an exclusive-use hardware based on a result of the comparison.

A semiconductor integrated circuit corresponding to the seventh method of configuring the information processing system is comprised of a circuit portion for realizing the comparison result based on the continuity parameters, data-dependency parameters, similarity parameters and weights of the continuity, data-dependency and similarity parameters by means of the programmable circuit and a circuit portion for realizing the same by means of the exclusive-use hardware.

According to the foregoing constitution, the continuity parameter, data-dependency parameter and similarity parameter for each module are judged as inputted conditions, the modules in which a possibility of changing the process is low, there is no dependence on the data volume and a high similarity is detected are allocated to the exclusive-use circuit. In such a manner, the circuit area can be minimized. On the contrary, the modules in which a possibility of changing the process is high, there is a high data dependency and a low similarity is detected are allocated to the programmable logic. The process can be thereby flexibly changed through rewriting the program. As a result, the programmable logic circuit can be downsized and the efficiency of the area utilization can be increased while the manufacturing cost can be curtailed.

An eighth method of configuring an information processing system, in an information processing system for realizing one or a plurality of applications, comprises:

a step of modeling all of the applications for each certain process level and inputting the models;

a step of inputting continuity parameters for the inputted models;

a step of inputting data-dependency parameters for the inputted models;

a step of inputting similarity parameters for the inputted models;

a step of comparing/selecting the models of the applications and the continuity parameters as inputted information with respect to a boundary condition, allocating one of the application models to programmable logic in accordance with a result of the comparison based on the continuity parameters and using another of the application models as an input in a comparison step based on the data-dependency parameters; and a step of comparing/selecting the data-dependency parameters and the comparison result as inputted information with respect to a boundary condition, allocating one of the application models to the programmable logic in accordance with a result of the comparison based on the data-dependency parameters and using another of the application models as an input in a comparison step based on the similarity parameters;

a step of comparing/selecting the similarity parameters and the comparison result as inputted information with respect to a boundary condition; and a step of outputting information that one of the application models is allocated to the programmable logic and another of the application models is allocated to an exclusive-use hardware in accordance with a result of the comparison based on the similarity parameters.

In the foregoing constitution, the thee types of parameters, which are the continuity parameters, data-dependency parameters and similarity parameters, are used in the same manner as in the seventh method of configuring the information processing system. However, the respective parameters are not weighted, and the allocations are sequentially judged through a plurality of stages in such manner that the judgment based on the continuity parameters in the first stage, the judgment based on the data-dependency parameters in the next stage, followed by the judgment based on the similarity parameters.

A semiconductor integrated circuit corresponding to the eighth method of configuring the information processing system is comprised of a circuit portion for realizing the comparison results based on the continuity parameters, data-dependency parameters and similarity parameters by means of the programmable logic and a circuit portion for realizing the same by means of the exclusive-use hardware.

According to the foregoing constitution, the modules in which the possibility of changing the process is low, there is no dependence on the data volume and the similarity is high are allocated to the exclusive-use circuit. Thereby, the circuit area can be minimized. On the contrary, the modules in which the possibility of changing the process is high, the data dependence is high and the similarity is low are allocated to the programmable logic. In the foregoing manner, the change can be flexibly handled through rewriting the program. The programmable circuit can be thereby downsized. Then, the manufacturing cost can be curtailed while the efficiency of the area utilization is increased.

A ninth method of configuring an information processing system, in an information processing system for realizing one or a plurality of applications, comprises:

a step of describing continuity parameters, data dependency parameters and similarity parameters in a C-language program modeled for each of certain process levels with respect to all of the applications;

a step of weighting the continuity parameters, data-dependency parameters and similarity parameters;

a step of comparing/selecting the models of the applications, continuity parameters, data-dependency parameters, similarity parameters and respective weights thereof as inputted information; and a step of outputting information that one of the application models is allocated to programmable logic and another of the application models is allocated to an exclusive-use hardware based on a result of the comparison.

A semiconductor integrated circuit corresponding to the ninth method of configuring the information processing system is comprised of a circuit portion for realizing the comparison result based on the continuity parameters, data-dependency parameters, similarity parameters and weights of the continuity, data-dependency and similarity parameters by means of the programmable logic and a circuit portion for realizing the same by means of the exclusive-use hardware.

According to the foregoing constitution, a processing efficiency can be increased because the continuity parameters, data-dependency parameters and similarity parameters are described in the C-language program.

A tenth method of configuring an information processing system, in an information processing system for realizing one or a plurality of applications, comprises:

a step of describing continuity parameters, data-dependency parameters and similarity parameters in a hardware description language modeled for each of certain process levels with respect to all of the applications;

a step of weighting the continuity parameters, data-dependency parameters and similarity parameters;

a step of comparing/selecting the models of the applications, continuity parameters, data-dependency parameters, similarity parameters and respective weights thereof as inputted information; and a step of outputting information that one of the application models is allocated to programmable logic and another of the application models is allocated to an exclusive-use hardware based on a result of the comparison.

According to the foregoing constitution, the processing efficiency can be increased because the continuity parameters, data-dependency parameters and similarity parameters are described in the hardware description language.

An 11th method of configuring an information processing system, in an information processing system for realizing one or a plurality of applications, comprises:

a step of describing continuity parameters and data-dependency parameters in a C-language program or a hardware description language modeled for each of certain process levels with respect to all of the applications;

a step of inputting the models and automatically extracting similarity parameters;

a step of weighting the continuity parameters, data-dependency parameters and similarity parameters;

a step of comparing/selecting the automatically extracted similarity parameters, continuity parameters and data-dependency parameters described in the models and respective weights thereof; and a step of outputting information that one of the application models is allocated to programmable logic and another of the application models is allocated to an exclusive-use hardware based on a result of the comparison.

A semiconductor integrated circuit corresponding to the 11th method of configuring the information processing system is comprised of a circuit part for realizing the comparison result based on the continuity parameters, data dependency parameters and similarity parameters and the weights of the continuity, data dependency and similarity parameters by means of the programmable logic and a circuit part for realizing the same by means of the exclusive-use hardware.

A level of commonality in the used circuits at each module level is extracted in the form of the similarity parameter in the C language and the hardware description language. The description of the similarity parameter can be omitted, by which the processing efficiency can be improved.

A 12th method of configuring an information processing system, in an information processing system for realizing one or a plurality of applications, comprises:

a step of describing continuity parameters, data-dependency parameters and similarity parameters in a C-language program modeled for each of certain process levels with respect to all of the applications;

a step of weighting the continuity parameters, data-dependency parameters and similarity parameters;

a step of comparing/selecting the models of the applications, continuity parameters, data-dependency parameters, similarity parameters and respective weights thereof as inputted information;

a step of allocating one of the application models to programmable logic and outputting circuit-formation information of the programmable logic based on a result of the comparison; and a step of allocating another of the application models to an exclusive-use hardware and outputting circuit-formation information of the exclusive-use circuit.

A semiconductor integrated circuit corresponding to the 12th method of configuring the information processing system is comprised of a circuit part for realizing the comparison result based on the continuity parameters, data-dependency parameters and similarity parameter and weights of the continuity, data-dependency and similarity parameters by means of the programmable logic and a circuit part for realizing the same by means of the exclusive-use hardware.

According to the foregoing constitution, the circuit-formation information of the programmable logic and the circuit-formation information of the exclusive-use circuit in order to downsize the programmable logic circuit and curtail the manufacturing cost while improving the efficiency of the area utilization can be obtained.

Hereinafter, methods of configuring an information processing system and a semiconductor integrated circuit according to preferred embodiments of the present invention are described referring to the drawings.

Embodiment 1

Figure 3:
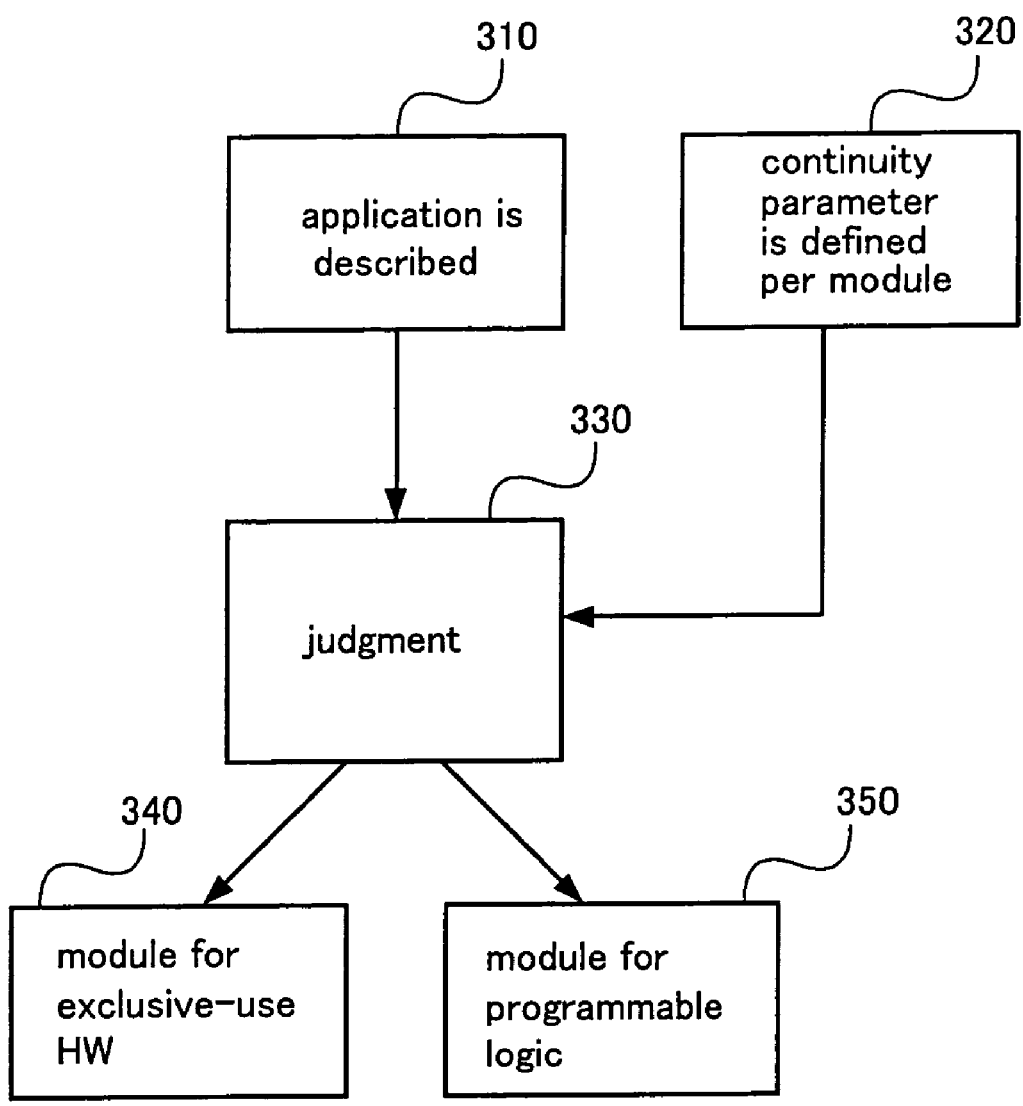
FIG. 3 is a flow chart illustrating a method of configuring an information processing system according to an embodiment 1 of the present invention.
Figure 4:
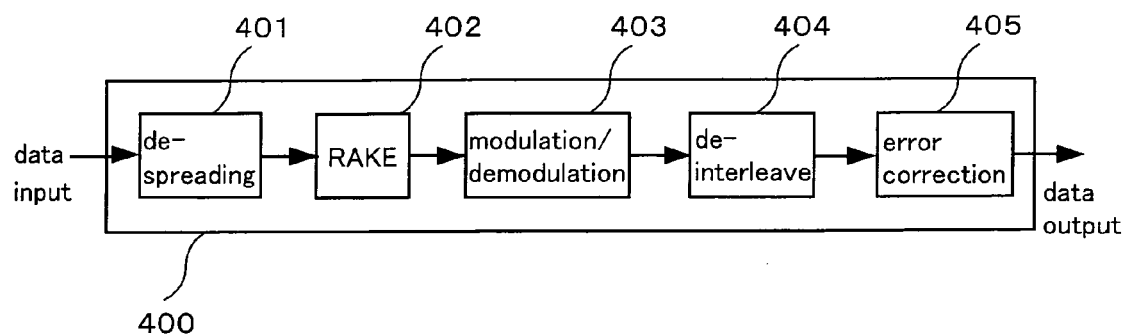
FIG. 4 is a block diagram of an application model according to the embodiment 1.
Figure 5:
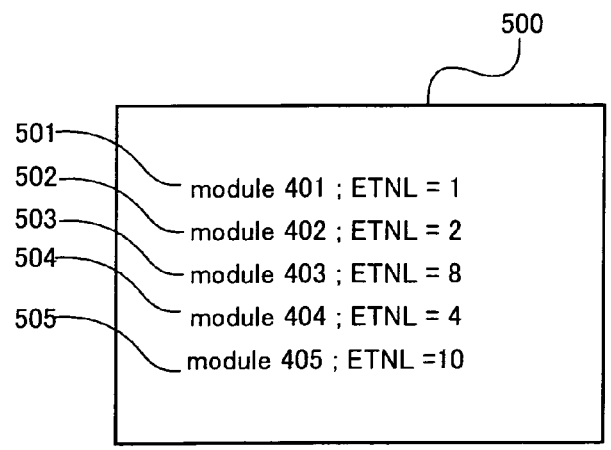
FIG. 5 is a block diagram of a file including continuity parameters according to the embodiment 1.

Hereinafter, a method of configuring an information processing system according to an embodiment 1 of the present invention is described referring to FIGS. 3 through 5.

In Step 310, a designer describes an application by means of a drawing or a language. For example, a high-level language such as C language or RTL (Register Transfer Level) is used to describe the application in a plurality of modules. FIG. 4 shows a demodulation process in CDMA (Code Division Multiple Access) communication as an example of the application.

A demodulation process 400 is comprised of five modules from a despreading 401 through an error correction 405, and the description is carried out in a language for each module. There is no limitation to a unit of the description.

In Step 320, a continuity parameter is inputted per module. The continuity parameter is an indicator which indicates if it is unnecessary to change a process at any time point in the future or if it is necessary to often change the process.

The continuity parameter is inputted in the following manner. As shown in FIG. 5, the designer creates a file 500 in which names of the five modules and the continuity parameters of the modules are made to respectively correspond to each other. For example, the module with a lower continuity is designated as "10", while the module with a higher continuity is designated as "1". A notation "module 401; ETNL=1" in a defining part 501 written in the file 500 denotes that the continuity parameter in a module 401 (representing despreading in the present embodiment) is "1", which means that the necessity of changing the despreading process is low. A notation "module405;ETNL=10" in a defining part 505 denotes that the continuity parameter in a module 405 (representing error correction in the present embodiment) is "10", which means that the necessity of changing the error-correction process is high. The description as above is carried out to all of the modules constituting the application 400. The notations of the continuity parameters are not limited to the before-mentioned examples in the present embodiment.

In Step 330, it is judged if the processes of the modules 401 through 405 described in the Step 310 are to be handled by means of programmable logic (for example, microcomputer, DSP, re-configurable LSI or the like) or an exclusive-use circuit based on the information relating to the continuity defined in the Step 320. First, it is judged if the numeral values of the continuity parameters (ETNL) described in the defining parts of the file 500 are larger or smaller than a predetermined numeral value. For example, it is assumed the rule that the module is allocated to the programmable logic when the numeral value of the ETNL equals to or exceeds "5" and allocated to the exclusive-use circuit when the numeral value of the ETNL falls below "5" is previously defined. Under the rule, it is decided that the module 401 is processed in the exclusive-use circuit and the module 405 is processed in the programmable logic.

Next, the application 400 is divided per module, and the descriptions of the respective modules are allocated to Steps 340 and 350, which will be described later, based on the decision made earlier. In the case of the present embodiment, the modules 401, 402 and 404 are allocated to the Step 340, while the modules 403 and 405 are allocated to the Step 350.

The Step 340 is in charge of a designing step for realizing the modules allocated in the Step 330 in the exclusive-use circuit. For example, the circuit is finished by means of a method such as logic synthesis based on the RTL descriptions of the modules 401, 402 and 404.

The Step 350 is in charge of a designing step for realizing the modules allocated in the Step 330 in the programmable logic. For example, the designer creates a program in which a particular programmable logic can be interpreted based on the specifics of the processes in the modules 403 and 405.

In the foregoing manner, each module constituting the application can be allocated to the suitable circuit based on the necessity of changing the relevant process used as an inputted condition. In other words, the module in which it is unnecessary to change the process thereafter is allocated to the excusive-use circuit so that a minimum circuit area can be achieved. On the contrary, in the case of the module in which it is highly necessary to change the process, the change can be flexibly handled by merely rewriting the program by means of the programmable logic such as microcomputer DSP or re-configurable LSI. As described, the area can be reduced and it is not necessary to remanufacture the circuit, which leads to the curtailment of a manufacturing cost.

Embodiment 2

Figure 6:
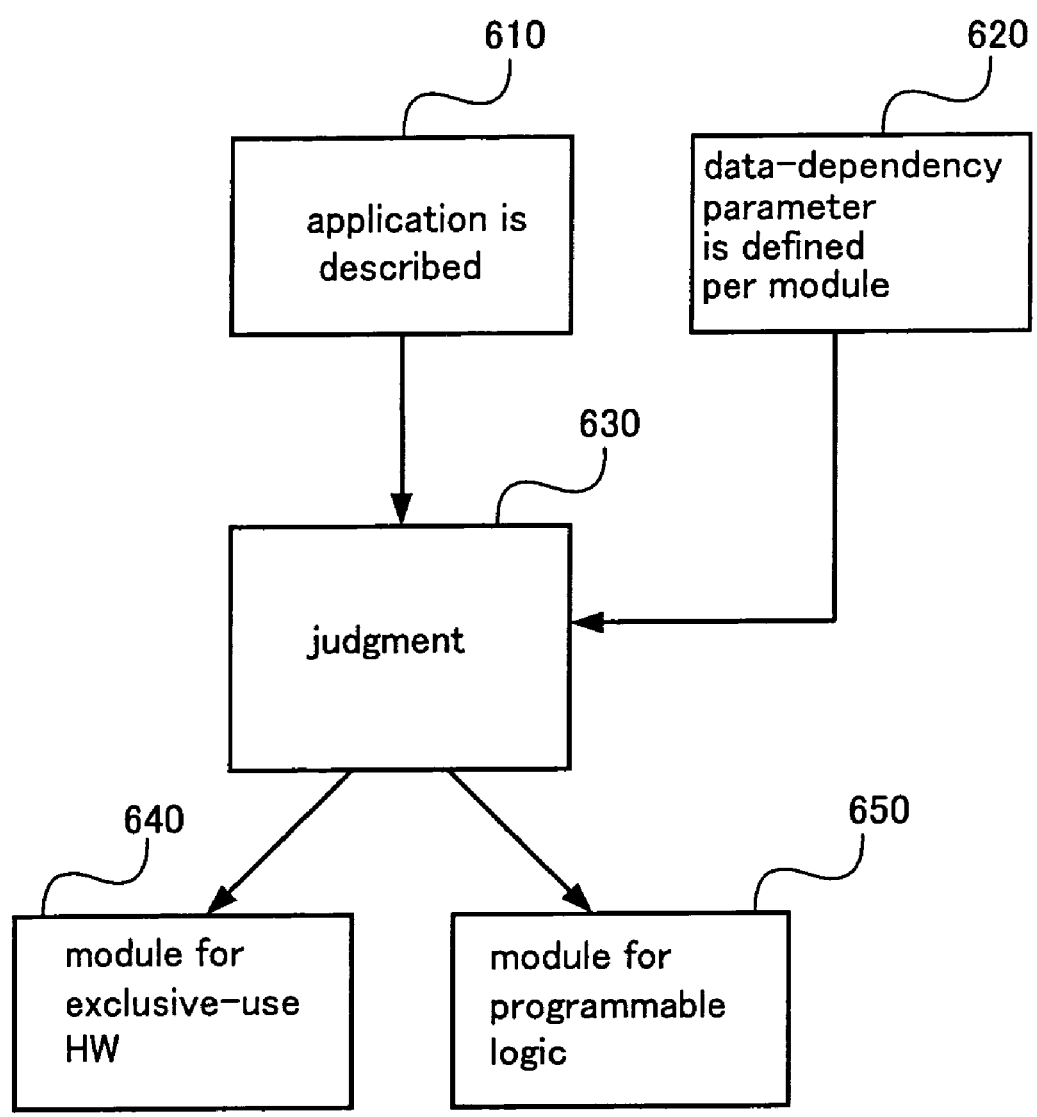
FIG. 6 is a flow chart illustrating a method of configuring an information processing system according to an embodiment 2 of the present invention.
Figure 7:
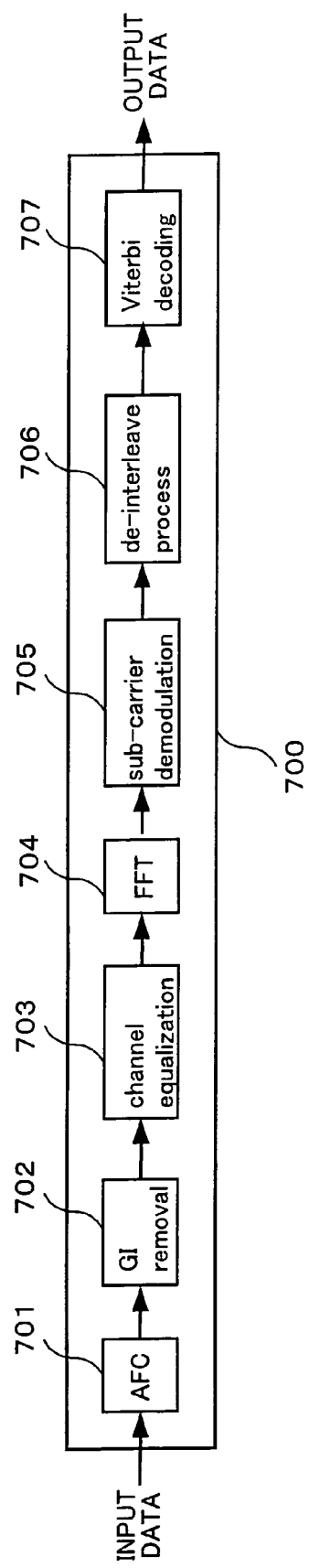
FIG. 7 is a block diagram of an application model according to the embodiment 2.
Figure 8:
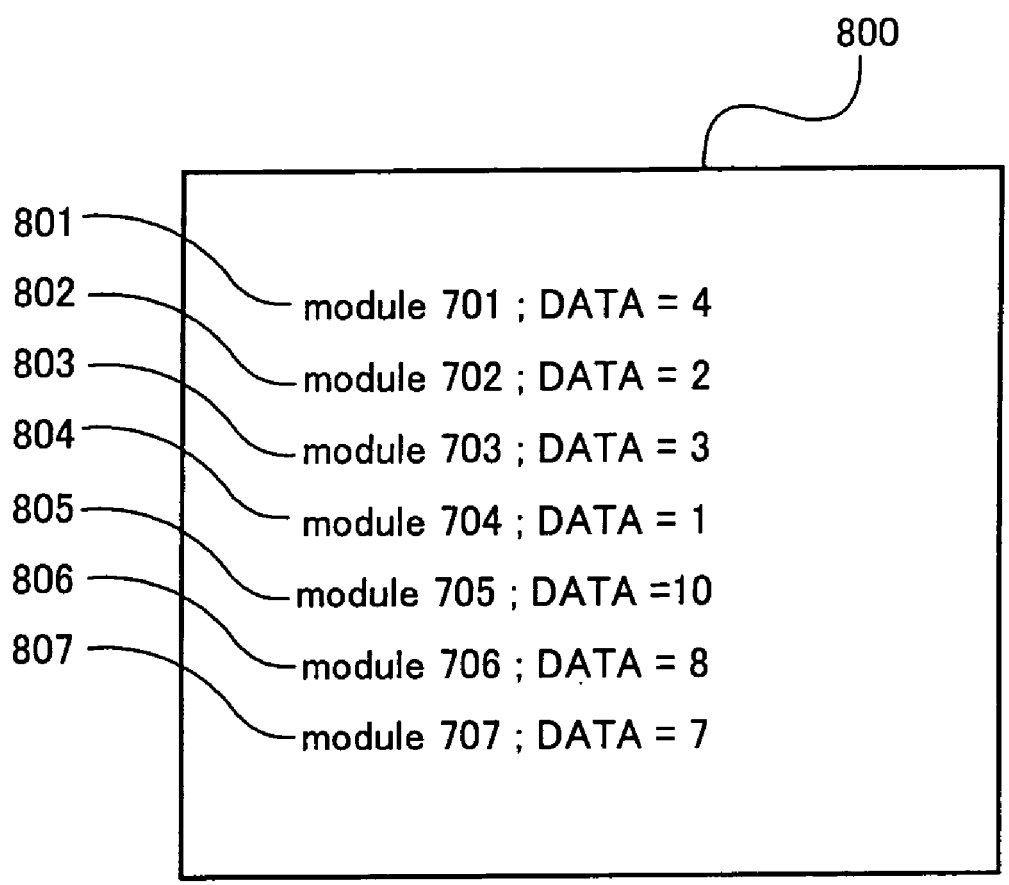
FIG. 8 is a block diagram of a file including data-dependency parameters according to the embodiment 2.

Hereinafter, a method of configuring an information processing system according to an embodiment 2 of the present invention is described referring to FIGS. 6 through 8.

In Step 610, the designer describes an application by means of a drawing or a language. For example, the description is carried out in the high-level language such as the C language and or RTL in a plurality of modules. As an example of the application, a demodulation process in wireless LAN (Local Area Network) communication is shown in FIG. 7.

A demodulation process 700 is comprised of seven modules from an automatic frequency control 701 to a Viterbi decoding 707, and the description is carried out for each module in a language. There is no limitation to a unit of the description.

In Step 620, a data-dependency parameter is inputted for each module. The data-dependency parameter is an indicator which indicates if a volume of data to be processed is constant or variable.

The data-dependency parameter is inputted in the following manner. As shown in FIG. 8, the designer creates a file 800 in which names of the seven modules and the data-dependency parameters of the modules are made to respectively correspond to each other. For example, the module with a higher data dependency is designated as "10", while the module with a lower data dependency is designated as "1". A notation "module704;DATA=1" in a defining part 804 written in the file 800 denotes that the data-dependency parameter in a module 704 (representing FFT (Fast Fourier Transformation) in the present embodiment) is "1", which means that a processing volume of the FFT is always constant regardless of a transfer rate (no data dependency). A notation "module705;DATA=10" in a defining part 805 denotes that the data-dependency parameter in a module 705 (representing subcarrier demodulation in the present embodiment) is "10", which means that the volume of the data to be processed in the subcarrier demodulation varies with a high possibility (high data dependency) in accordance with a modulation method (BPSK, QPSK, 16QAM or 64QAM). The description as above is carried out to all of the modules constituting the application 700. The notations of the data-dependency parameters are not limited to the before-mentioned examples in the present embodiment.

In Step 630, it is judged if the processes of the modules 701 through 707 described in the Step 620 are to be executed by means of the programmable logic or the exclusive-use circuit based on the information relating to the data dependency defined in the Step 620. First, it is judged if the data-dependency parameters (DATA) described in the defining parts of the file 800 are larger or smaller than a predetermined numeral value. For example, it is assumed the rule that the module is allocated to the programmable logic when the numeral value of the DATA equals to or exceeds "5" and allocated to the exclusive-use circuit when the numeral value of the DATA falls below "5" is previously defined. Under the rule, it is decided that the module 704 is processed in the exclusive-use circuit and the module 705 is processed in the programmable logic.

Next, the application 700 is divided per module, and the descriptions of the respective modules are allocated to Steps 640 and 650, which will be described later, based on the decision made earlier. In the case of the present embodiment, the modules 701, 702, 703 and 704 are allocated to the Step 640, while the modules 705, 706 and 707 are allocated to the Step 650.

The Step 640 is in charge of a designing step for realizing the modules allocated in the Step 630 in the exclusive-use circuit. For example, the circuit is finished by means of a method such as logic synthesis based on the RTL descriptions of the modules 701, 702, 703 and 704.

The Step 650 is in charge of a designing step for realizing the modules allocated in the Step 630 by means of the programmable logic. For example, the designer creates a program in which a particular programmable logic can be interpreted based on the specifics of the processes in the modules 705, 706 and 707.

In the foregoing manner, each module constituting the application can be allocated to the suitable circuit based on the data dependency of the relevant process used as an inputted condition. In other words, in the case of the module whose volume of the data to be processed is constant, the circuit area can be minimized while the power consumption is reduced when an optimum circuit is configured by means of the exclusive-use circuit. On the contrary, in the case of the module whose volume of the data to be processed is variable with a high possibility, the configuration of the programmable logic circuit can be optimized when the program is merely rewritten, and the change can be flexibly handled.

When the circuit is designed so as to respond to a most arduous processing, the area and the power consumption are increased. In order to solve the problem, when the process including the data dependency is allocated to the programmable logic, while the process including no data dependency is allocated to the exclusive-use hardware, as recited in the present embodiment, the area of the semiconductor integrated circuit can be minimized and the manufacturing cost can be reduced. Further, an optimum circuit can be configured depending on the process to be executed, which reduces a processing frequency and power consumption.

Embodiment 3

Figure 9:
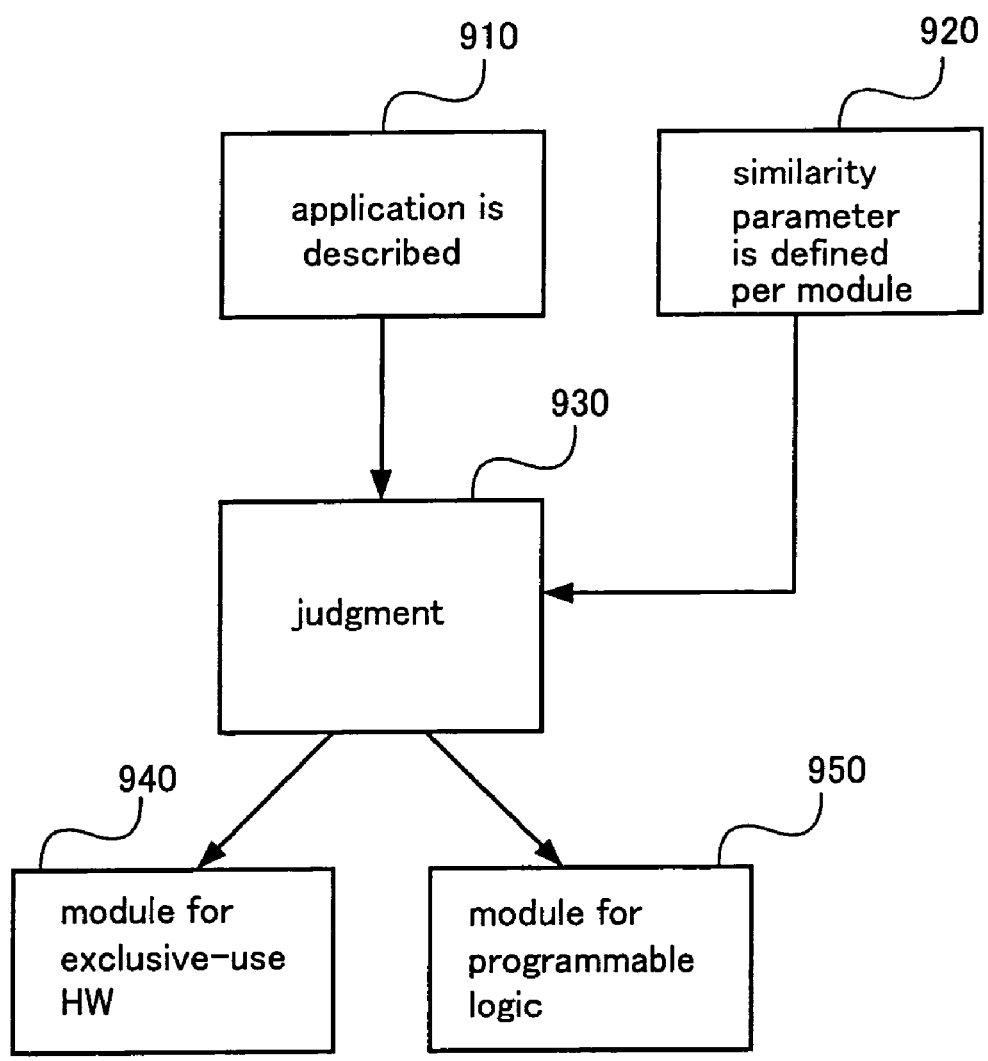
FIG. 9 is a flow chart illustrating a method of configuring an information processing system according to an embodiment 3 of the present invention.
Figure 10A:
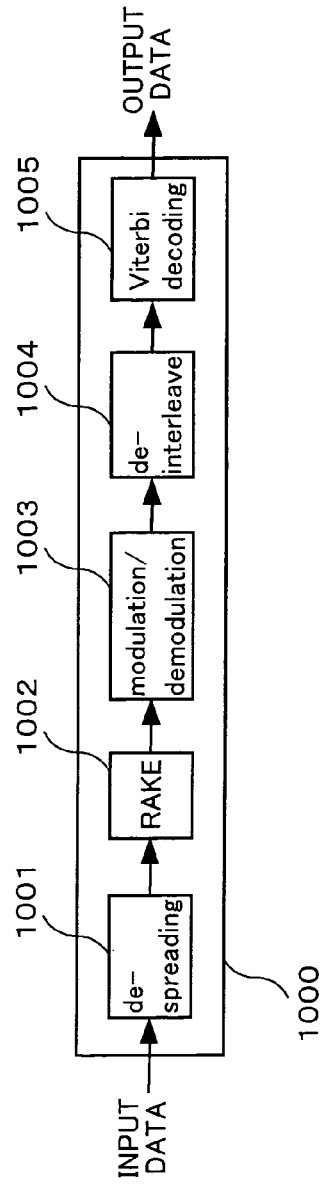
FIGS. 10A and 10B are block diagrams of application models according to the embodiment 3.
Figure 10B:
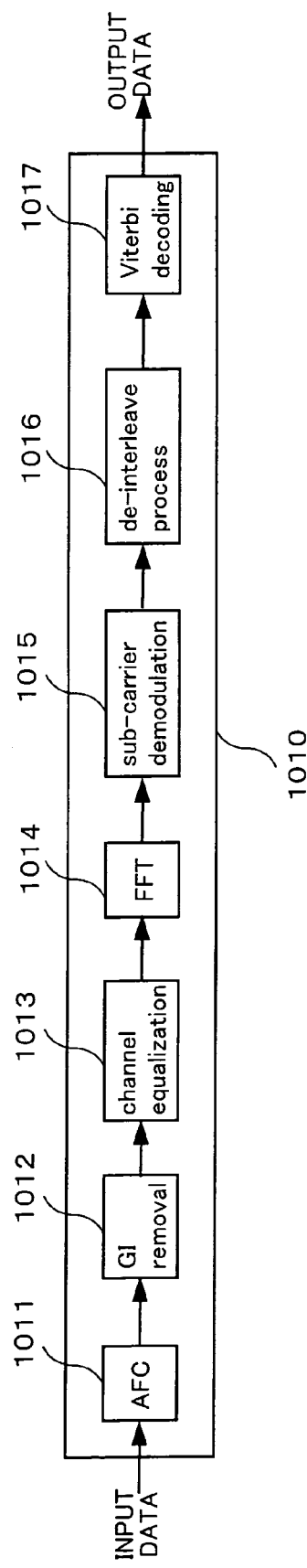
Figure 11:
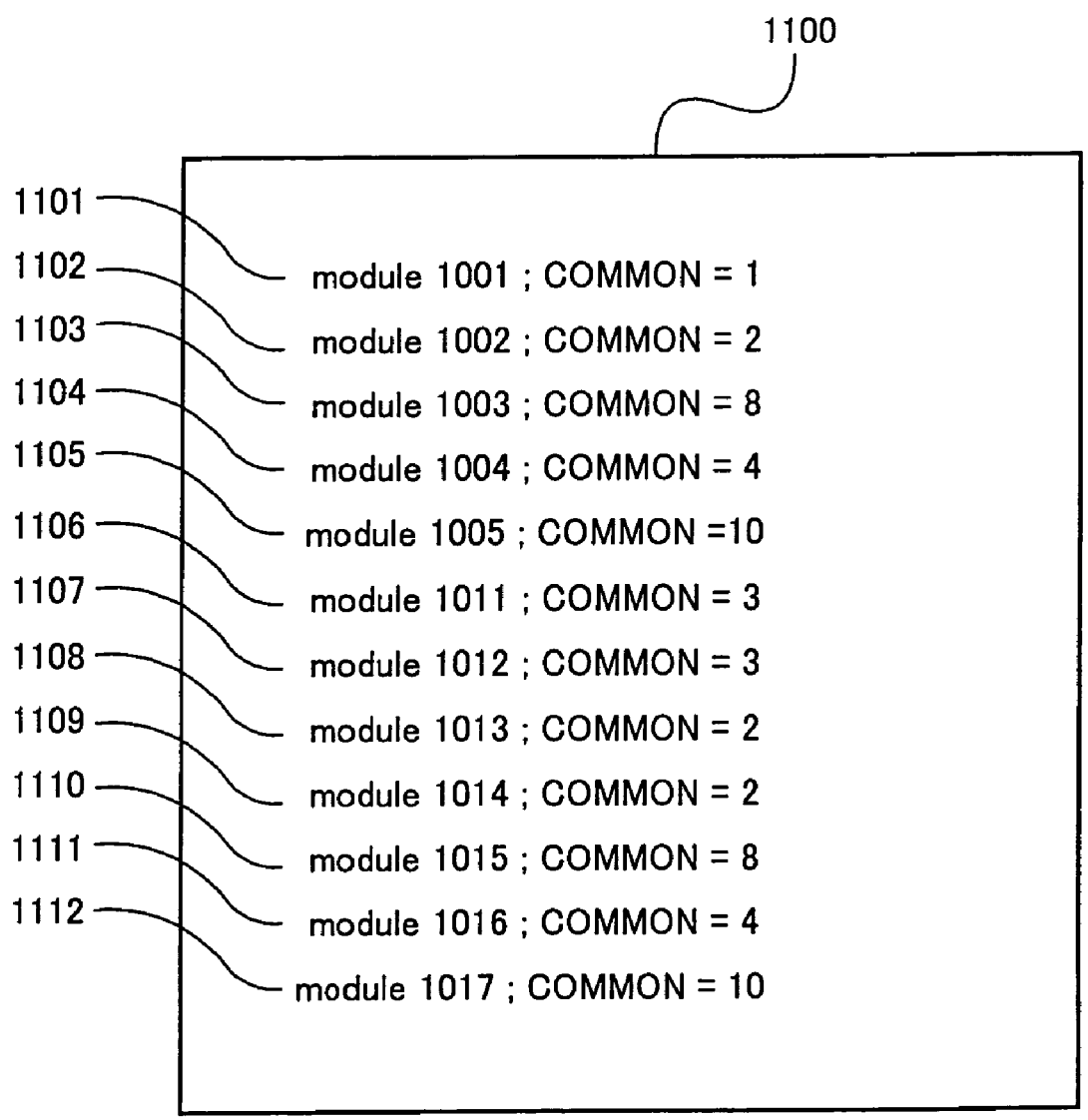
FIG. 11 is a block diagram of a file including similarity parameters according to the embodiment 3.
Figure 12:
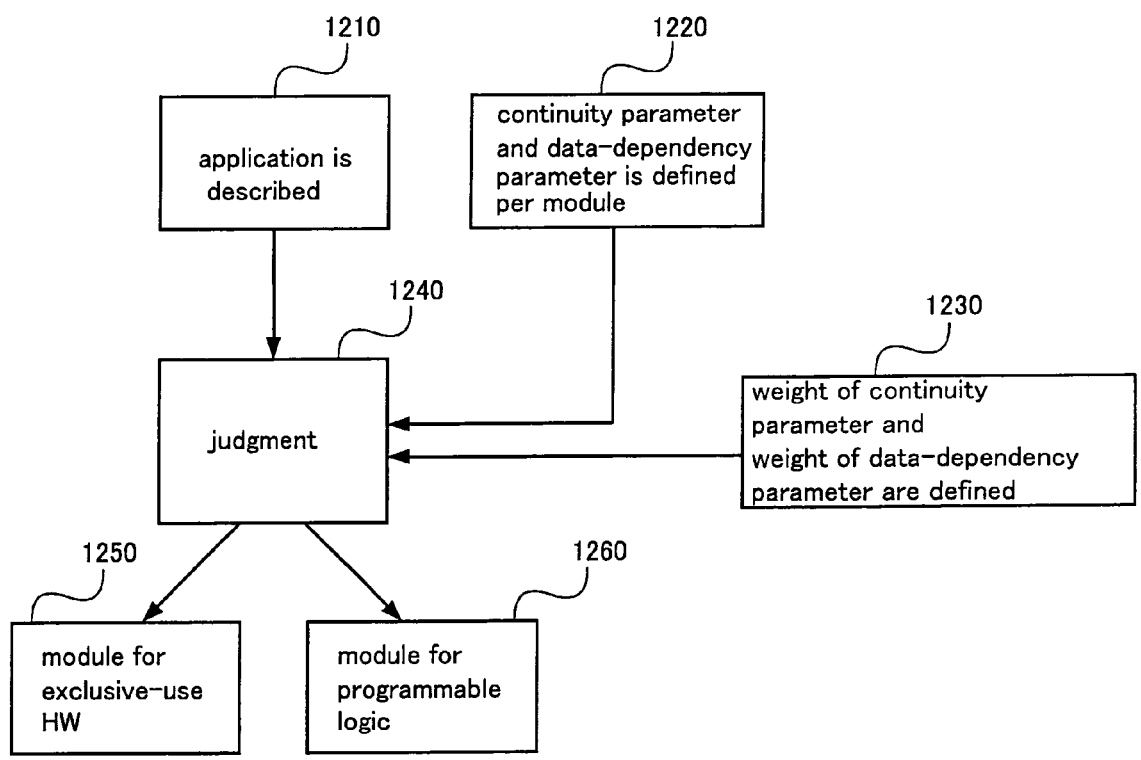
FIG. 12 is a flow chart illustrating a method of configuring an information processing system according to an embodiment 4 of the present invention.

Hereinafter, a method of configuring an information processing system according to an embodiment 3 of the present invention is described referring to FIGS. 9 through 11.

In Step 910, the designer describes an application by means of a drawing or a language. For example, the description is carried out in a plurality of modules by means of the high-level language such as the C language or RTL. As an example of the application, a demodulation process (1000) in the CDMA communication is shown in FIG. 10A, and a demodulation process (1010) in the wireless LAN communication is shown in FIG. 10B. The demodulation process 1000 of the CDMA communication is comprised of five modules from a despreading 1001 to a Viterbi decoding 1005, and the demodulation process 1010 is comprised of seven modules from an automatic frequency control 1011 to a Viterbi decoding 1017, based on which the description is carried out in a language. There is no limitation to a unit of the description.

In Step 920, a similarity parameter is inputted as an indicator which indicates if there is any similar process among the modules.

The similarity parameter is inputted in the following manner. As shown in FIG. 11, the designer creates a file 1100 in which names of the 12 modules and the similarity parameters of the modules are made to respectively correspond to each other. For example, the modules including more similar processes is designated as "10", decreasing toward "1" as the modules include less similar processes. A notation "module1005;COMMON=10" in a defining part 1105 written in the file 1100 denotes that the similarity parameter in a module 1005 (representing Viterbi decoding of CDMA communication in the present embodiment) is "10" A notation "module1017;COMMMON=10" in a defining part 1112 written in the file 1100 denotes that the similarity parameter in a module 1017 (representing Viterbi decoding of wireless LAN communication in the present embodiment) is "10", This means that there is a similarity between the Viterbi decoding of the CDMA communication and the Viterbi decoding of the wireless LAN communication. A notation "module1001;COMMMON=1" in a defining part 1101 denotes that the similarity parameter in a module 1001 (representing despreading of CDMA communication in the present embodiment) is "1", which means that there is no module in which the similarity is detected in the case of the despreading process in the CDMA communication 1000 and the wireless LAN communication 1010. The description as above is carried out to all of the modules constituting the applications 1000 and 1010. The notations of the similarity parameters are not limited to the before-mentioned examples in the present embodiment.

In Step 930, it is judged if the processes of the modules 1001 through 1005 and 1011 through 1017 described in the Step 910 are to be executed by means of the programmable logic or the exclusive-use circuit based on the information relating to the similarity defined in the Step 920. First, it is judged if the similarity parameters (COMMON) described in the defining parts of the file 1100 are larger or smaller than a predetermined numeral value. For example, it is assumed the rule that the module is allocated to the exclusive-use circuit when the numeral value of the COMMON exceeds "5" and allocated to the programmable logic when the numeral value of the COMMON equals to or falls below "5" is previously defined. Under the rule, it is decided that the modules 1005 and 1017 are processed in the exclusive-use circuit and the module 1001 is processed in the programmable logic.

Next, the applications 1000 and 1010 are divided per module, and the descriptions of the respective modules are allocated to Steps 940 and 950, which will be described later, based on the decision made earlier. In the case of the present embodiment, the modules 1003, 1005, 1015 and 1017 are allocated to the Step 940, while the modules 1001, 1002, 1004, 1011, 1012, 1013, 1014 and 1016 are allocated to the Step 950.

The Step 940 is in charge of designing the exclusive-use circuit in such manner that all of the modules allocated in the Step 930 can share any similarity among them. For example, the circuit is finished by means of a method such as logic synthesis based on the RTL descriptions of the modules 1003, 1005, 1015 and 1017.

The Step 950 is in charge of a designing step for realizing the modules allocated in the Step 930 by means of the programmable logic. For example, the designer creates a program in which a particular programmable logic can be interpreted based on the specifics of the processes in the modules 1001, 1002, 1004, 1011, 1012, 1013, 1014 and 1016.

In the foregoing manner, each module constituting the application can be allocated to the suitable circuit based on the similarity among the modules used as an inputted condition. In other words, in the presence of the modules in which the processes are similar, the circuit is commonly used so that the circuit configuration can be optimized by means of the exclusive-use circuit. Thereby, the circuit minimizing the area and reducing the power consumption can be realized. On the contrary, in the case of the modules in which the similarity is hardly detected, the change can be flexibly handled because the configuration of the programmable circuit can be optimized when the program is merely rewritten despite the disadvantage that it is difficult to share the circuit.

The circuit area can be minimized and the manufacturing cost can be curtailed by realizing the modules capable of sharing the circuit by means of the exclusive-use circuit, while realizing the modules in which it is difficult to share the circuit by means of the programmable logic.

Embodiment 4

Hereinafter, a method of configuring an information processing system according to an embodiment 4 of the present invention is described referring to FIGS. 12 through 15.

In Step 1210, the designer describes an application by means of a drawing or a language. For example, the description is carried out in a plurality of modules by means of the high-level language such as the C language or RTL. As an example of the application, the demodulation process in the CDMA communication is shown in FIG. 4.

The demodulation process 400 is comprised of the five modules from the despreading 401 through the error correction 405, and the description is carried out for each module in a language. There is no limitation to a unit of the description.

Figure 13:
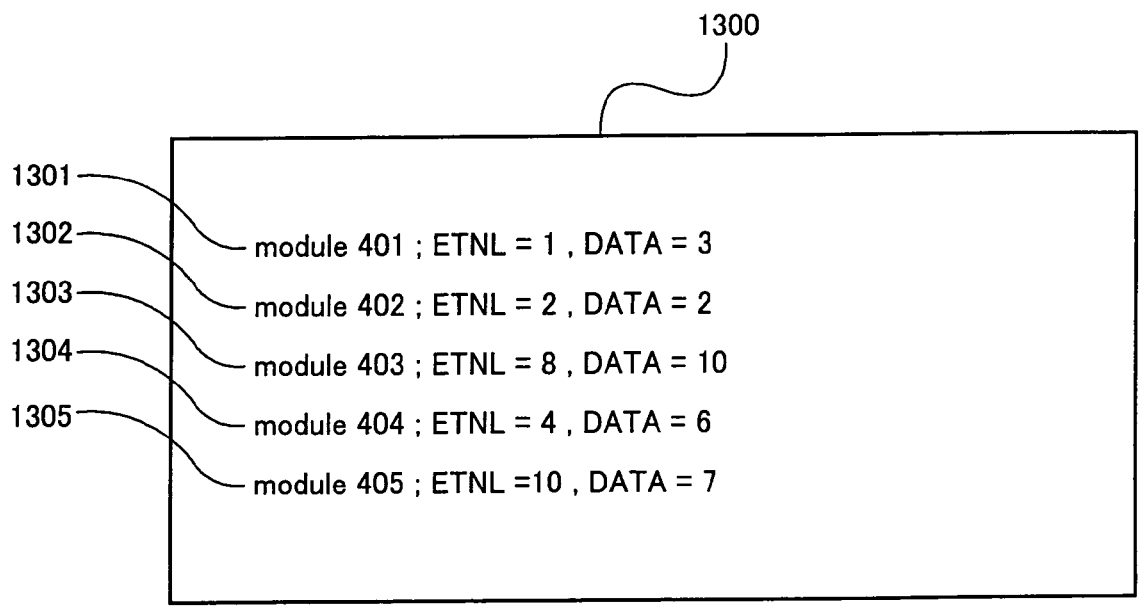
FIG. 13 is a block diagram of a file including respective continuity parameters and data-dependency parameters according to the embodiment 4.
Figure 14:
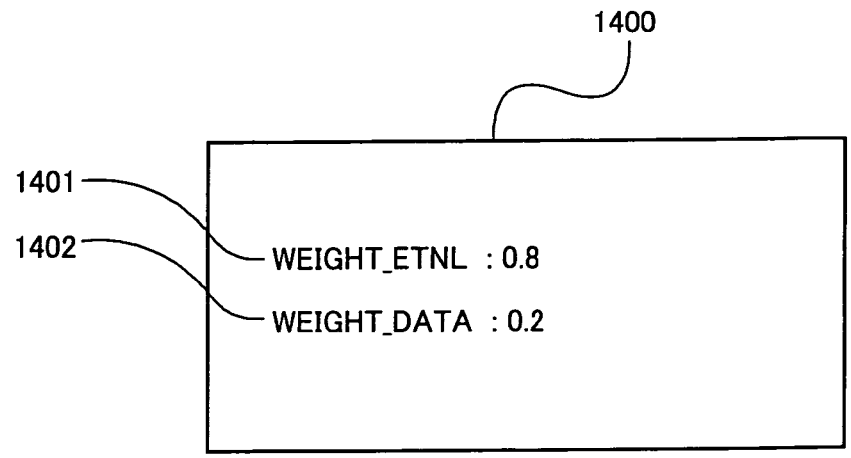
FIG. 14 is a block diagram of a file including weights of the continuity and the data dependency according to the embodiment 4.

In Step 1220, the continuity parameter and the data-dependency parameter are inputted for each module. The continuity parameter and the data-dependency parameter are inputted in the following manner. As shown in FIG. 13, the designer creates a file 1300 in which names of the five modules and the continuity and data-dependency parameters of the modules are made to respectively correspond to each other. A notation "module401;ETNL=1,DATA=3" in a defining part 1301 written in the file 1300 denotes that the continuity parameter in the module 401 (representing despreading in the present embodiment) is "1" and the data-dependency parameter therein is "3", which means that the necessity of changing the despreading process is low and the processing data volume is not largely changed based on the data dependency. A notation "module405;ETNL=10,DATA=7" in a defining part 1305 denotes that the continuity parameter in the module 405 (representing error correction in the present embodiment) is "10" and the data-dependency parameter therein is "7", which means that the necessity of changing the error correction process is high and the processing data volume significantly changes due to the data dependency. The description as above is carried out to all of the modules constituting the application 400. The notations of the continuity parameters and the data-dependency parameters are not limited to the before-mentioned examples in the present embodiment.

In Step 1230, weights of the continuity parameter and the data-dependency parameter are defined. For example, as shown in a file 1400 of FIG. 14, a notation "WEIGHT_ETNL: 0.8" in a defining part 1401 denotes that the weight of the continuity parameter is 0.8. A notation "WEIGHT_DATA: 0.2" in a defining part 1402 denotes that the weight of the data-dependency parameter is 0.2. The weights of the continuity parameter and the data-dependency parameter are not limited to the before-mentioned examples in the present embodiment.

In Step 1240, it is judged if the processes of the modules 401 through 405 described in the Step 1210 are to be executed by means of the programmable logic or the exclusive-use circuit based on the information relating to the continuity and the information relating to the data-dependency defined in the Step 1220 and the weights of the continuity and the data dependency defined in the Step 1230. First, a calculation is carried out in a predetermined calculation formula using the continuity parameters (ETNL) and the data-dependency parameters (DATA) described in the defining parts of the file 1300 and the weight of the continuity (WEIGHT_ETNL) and the weight of the data-dependency (WEIGHT_DATA) described in the defining parts of the file 1400 as elements. Then, it is judged if a result of the calculation is larger or smaller than a predetermined numeral value.

An example of the calculation formula used here is (ETNL×WEIGHT_ETNL+DATA×WEIGHT_DATA), in which the continuity and the data dependency are added.

For example, it is assumed the rule that the module is allocated to the programmable logic when the calculation result equals to or exceeds "5" and allocated to the exclusive-use circuit when the calculation result falls below "5" is previously defined.

Under the rule, it is decided that the process of the module 401 is executed in the exclusive-use circuit because the calculation result is "1.4" and the process of the module 405 is executed in the programmable logic because the calculation result is "9.4". The calculation formula is not limited to the foregoing example. The calculation result obtained in the present embodiment is shown in FIG. 15.

Next, the application 400 is divided per module, and the descriptions of the respective modules are allocated to Steps 1250 and 1260, which will be described later, based on the foregoing calculation result. In the case of the present embodiment, the modules 401, 402 and 404 are allocated to the Step 1250, while the modules 403 and 405 are allocated to the Step 1260.

The Step 1250 is in charge of a designing step for realizing the modules allocated in the Step 1240 by means of the exclusive-use circuit. For example, the circuit is finished by means of a method such as logic synthesis based on the RTL descriptions of the modules 401, 402 and 404.

The Step 1260 is in charge of a designing step for realizing the modules allocated in the Step 1240 by means of the programmable logic. For example, the designer creates a program in which a particular programmable logic can be interpreted based on the specifics of the processes in the modules 403 and 405.

In the foregoing manner, each module constituting the application can be allocated to the suitable circuit based on the necessity of the change and the data dependency relating to the relevant process used as inputted conditions. In other words, the module in which the process change is thereafter unnecessary and the data dependency is low is allocated to the exclusive-use circuit so that the circuit area can be minimized. On the contrary, in the case of the module in which the process change is highly necessary and the data dependency is high, a flexible response to the change is realized by merely rewriting the program in the programmable logic. As described, because the area reduction is realized and the remake of the circuit is unnecessary, the manufacturing cost can be curtailed.

Embodiment 5

Hereinafter, a method of configuring an information processing system according to an embodiment 5 of the present invention is described referring to FIGS. 16 through 19.

In Step 1610, the designer describes an application by means of a drawing or a language. For example, the description is carried out in a plurality of modules by means of the high-level language such as the C language or RTL. FIGS. 10A and 10B are applied as examples of the application.

Figure 17:
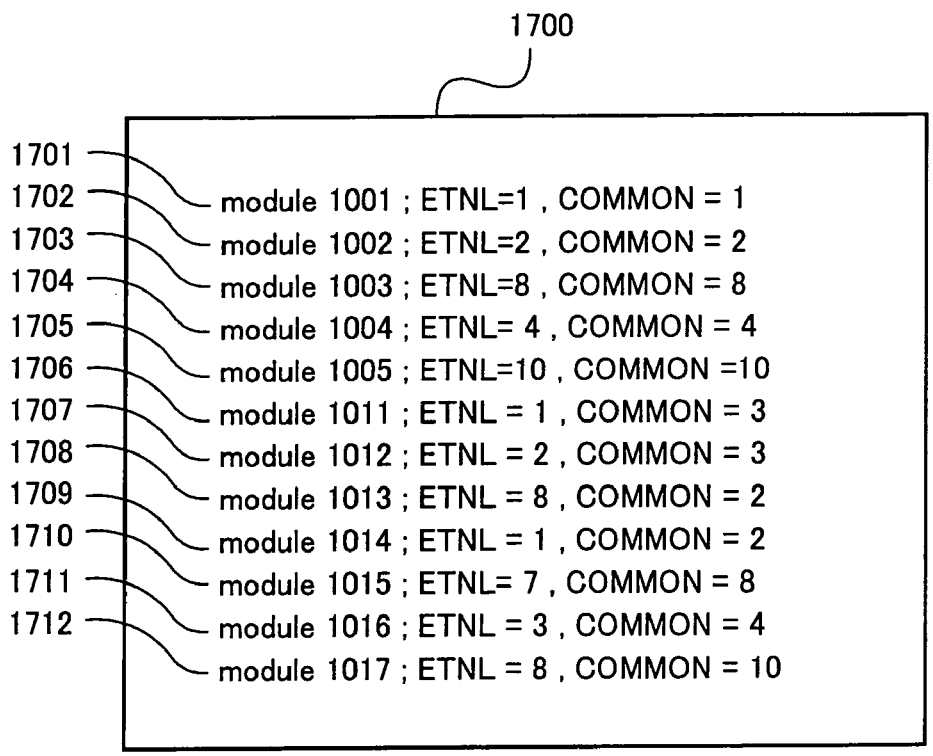
FIG. 17 is a block diagram of a file including respective continuity parameters and similarity parameters according to the embodiment 5.
Figure 18:
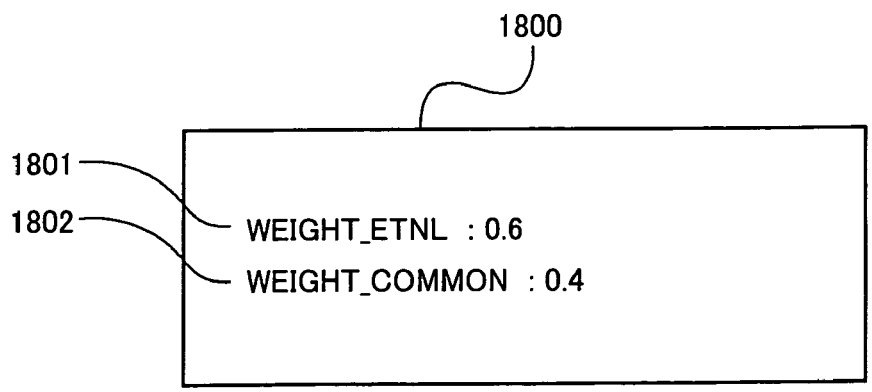
FIG. 18 is a block diagram of a file including weights of the continuity and the similarity according to the embodiment 5.

In Step 1620, the continuity parameter and the similarity parameter are inputted for each module. The continuity parameter and the similarity parameter are inputted in the following manner. As shown in FIG. 17, the designer creates a file 1700 in which names of the respective modules and the continuity and similarity parameters of the modules are made to respectively correspond to each other. A notation "module1001;ETNL=1,COMMON=1" in a defining part 1701 written in the file 1700 denotes that the continuity parameter in the module 1001 (representing despreading in the present embodiment) is "1" and the similarity parameter therein is "1". A notation "module1014;ETNL=1,COMMON=2" in a defining part 1709 denotes that the continuity parameter in the module 1014 (representing FFT in the present embodiment) is "1" and the similarity parameter therein is "2". The description as above is carried out to all of the modules constituting the applications 1000 and 1010. The notations of the continuity and similarity parameters are not limited to the before-mentioned examples in the present embodiment.

In Step 1630, weights of the continuity parameter and the similarity parameter are defined. For example, as shown in a file 1800 of FIG. 18, a notation "WEIGHT_ETNL:0.6" in a defining part 1801 denotes that the weight of the continuity parameter is "0.6". A notation "WEIGHT_COMMON:0.4" in a defining part 1802 denotes that the weight of the similarity parameter is "0.4". The weights of the continuity parameter and the similarity parameter are not limited to the before-mentioned examples in the present embodiment.

In Step 1640, it is judged if the processes of the modules 1001 through 1017 described in the Step 1610 are to be executed by means of the programmable logic or the exclusive-use circuit based on the information relating to the continuity and the information relating to the similarity defined in the Step 1620 and the weights of the continuity and the similarity defined in the Step 1630. First, a calculation is carried out in a predetermined calculation formula using the continuity parameters (ETNL) and the similarity parameters (COMMON) described in the defining parts of the file 1700 and the weight of the continuity (WEIGHT_ETNL) and the weight of the similarity (WEIGHT_COMMON) described in the defining parts of the file 1800 as elements. Then, it is judged if a result of the calculation is larger or smaller than a predetermined numeral value.

An example of the calculation formula used here is (ETNL×WEIGHT_ETNL−COMMON×WEIGHT_COMMON), in which the similarity is subtracted from the continuity.

For example, it is assumed the rule that the module is allocated to the programmable logic when the calculation result exceeds "0" and allocated to the exclusive-use circuit when the calculation result equals to or falls below "0" is previously defined.

Under the rule, it is decided that the module 1001 is allocated to the programmable logic because the calculation result is "0.2" and the module 1014 is allocated to the exclusive-use circuit because the calculation result is "−0.2". The calculation formula is not limited to the foregoing example. The calculation result obtained in the present embodiment is shown in FIG. 19.

Next, the applications 1000 and 1010 are divided per module, and the descriptions of the respective modules are allocated to Steps 1650 and 1660, which will be described later, based on the foregoing calculation result. In the case of the present embodiment, the modules 1011, 1012 and 1014 are allocated to the Step 1650, while the modules 1001-1005, 1013 and 1015-1017 are allocated to the Step 1660.

The Step 1650 is in charge of a designing step for realizing the modules allocated in the Step 1640 by means of the exclusive-use circuit. For example, the circuit is finished by means of a method such as logic synthesis based on the RTL descriptions.

The Step 1660 is in charge of a designing step for realizing the modules allocated in the Step 1640 by means of the programmable logic. For example, the designer creates a program in which a particular programmable logic can be interpreted based on the specifics of the processes in the modules.

In the foregoing manner, each module constituting the application can be allocated to the suitable circuit based on the necessity of the process change and the similarity relating to the relevant process used as inputted conditions. In other words, the module in which the process change is thereafter unnecessary and the similarity is high is allocated to the exclusive-use circuit so that the circuit area can be minimized. On the contrary, in the case of the module in which the process change is highly necessary and the similarity is low, a flexible response to the change is realized by merely rewriting the program in the programmable logic. As described, because the area reduction is realized and the remake of the circuit is unnecessary, the manufacturing cost can be curtailed.

Embodiment 6

Hereinafter, a method of configuring an information processing system according to an embodiment 6 of the present invention is described referring to FIGS. 20 through 23. FIGS. 10A and 10B are applied as examples of the application.

In Step 2010, the designer describes an application by means of a drawing or a language. For example, the description is carried out in a plurality of modules by means of the high-level language such as the C language or RTL.

Figure 21:
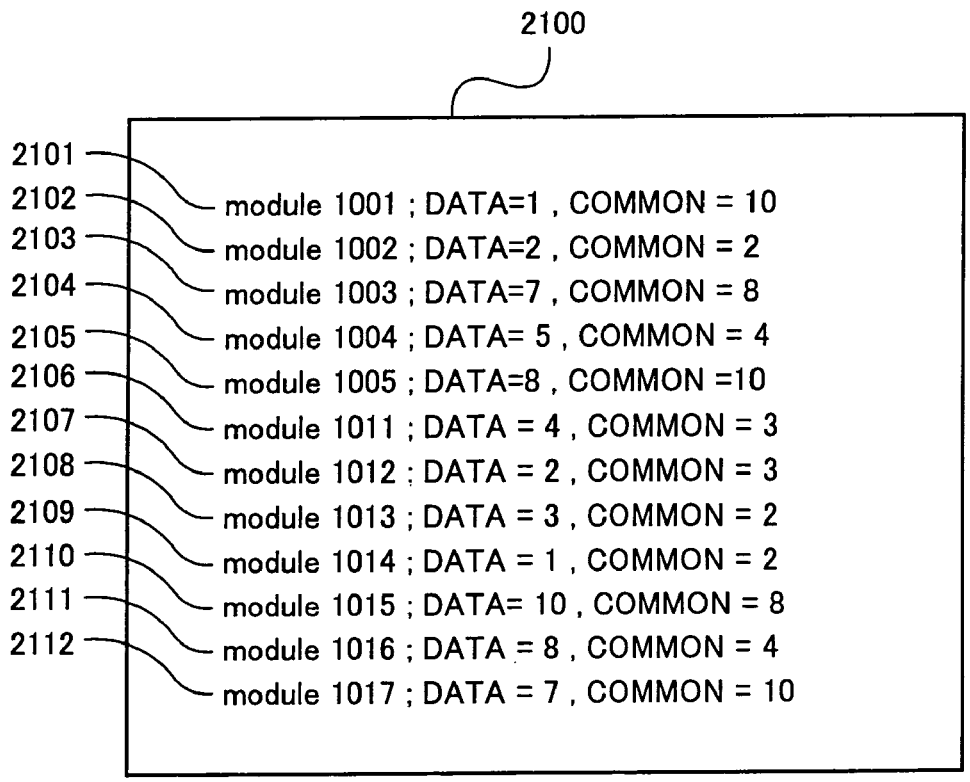
FIG. 21 is a block diagram of a file including respective data-dependency parameters and similarity parameters according to the embodiment 6.
Figure 22:
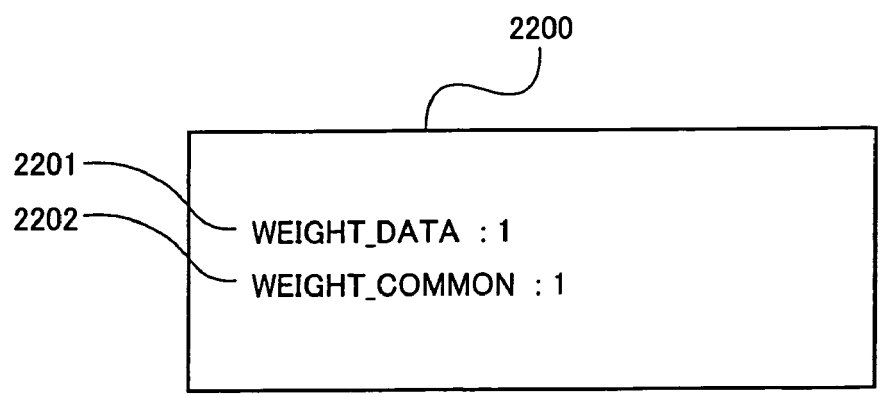
FIG. 22 is a block diagram of a file including weights of the data dependency and the similarity according to the embodiment 6.
Figure 24:
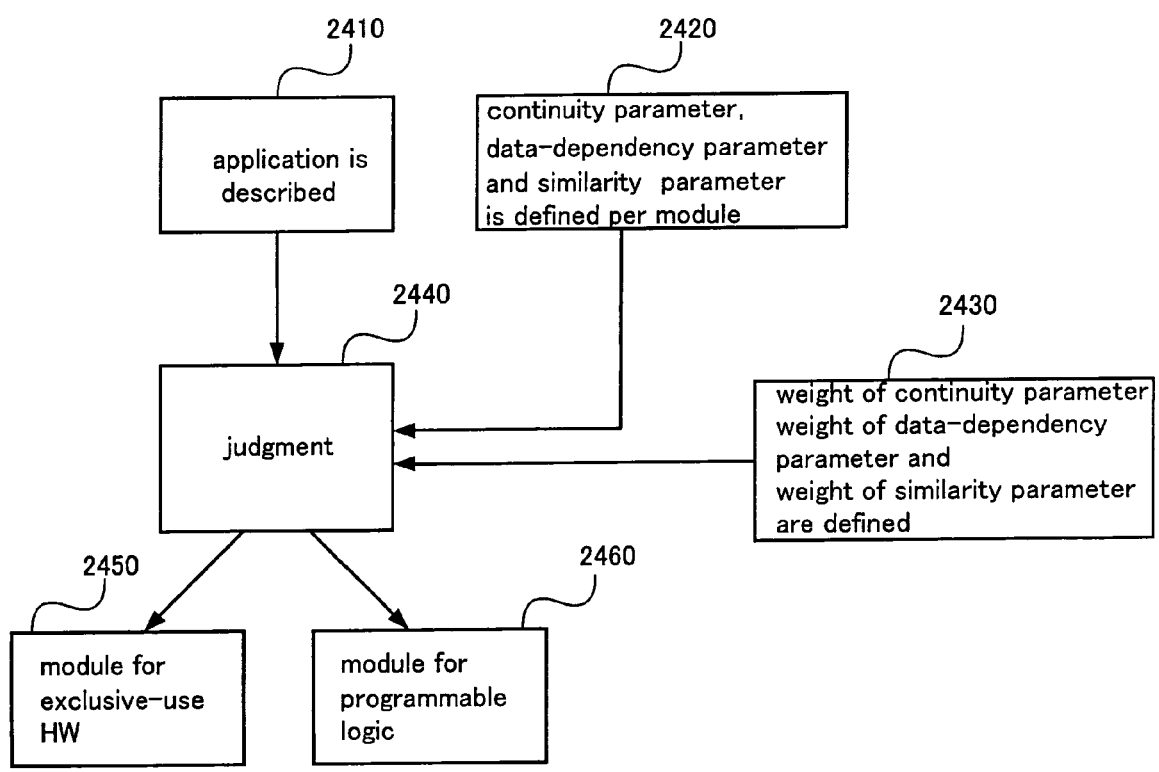
FIG. 24 is a flow chart illustrating a method of configuring an information processing system according to an embodiment 7 of the present invention.

In Step 2020, the data-dependency parameter and the similarity parameter are inputted for each module in the following manner. As shown in FIG. 21, the designer creates a file 2100 in which names of the respective modules and the data-dependency and similarity parameters of the modules are made to respectively correspond to each other. A notation "module1001;DATA=1,COMMON=10" in a defining part 2101 written in the file 2100 denotes that the data-dependency parameter in the module 1001 (representing despreading in the present embodiment) is "1" and the similarity parameter therein is "10". A notation "module1016;DATA=8, COMMON=4" in a defining part 2111 denotes that the data-dependency parameter in the module 1016 (representing de-interleave in the present embodiment) is "8" and the similarity parameter therein is "4". The description as above is carried out to all of the modules constituting the applications 1000 and 1010. The notations of the data-dependency and similarity parameters are not limited to the before-mentioned examples in the present embodiment.

In Step 2030, weights of the data-dependency parameter and the similarity parameter are defined. For example, as shown in a file 2200 of FIG. 22, a notation "WEIGHT_DATA:1" in a defining part 2201 denotes that the weight of the data-dependency parameter is "1". A notation "WEIGHT_COMMON:1" denotes that the weight of the similarity parameter in a defining part 2202 is "1". The weights of the data-dependency parameter and the similarity parameter are not limited to the before-mentioned examples in the present embodiment.

In Step 2040, it is judged if the processes of the modules 1001 through 1017 described in the Step 2010 are to be executed by means of the programmable logic or the exclusive-use circuit based on the information relating to the data dependency and the similarity defined in the Step 2020 and the weights of the data dependency and the similarity defined in the Step 2030. First, a calculation is carried out in a predetermined calculation formula using the data-dependency parameters (DATA) and the similarity parameters (COMMON) described in the defining parts of the file 2100 and the weight of the data dependency (WEIGHT_DATA) and the weight of the similarity (WEIGHT_COMMON) described in the defining parts of the file 2200 as elements. Then, it is judged if a result of the calculation is larger or smaller than a predetermined numeral value.

An example of the calculation formula used here is (DATA×WEIGHT_DATA−COMMON×WEIGHT_COMMON), in which the similarity is subtracted from the data dependency.

For example, it is assumed the rule that the module is allocated to the programmable logic when the calculation result exceeds "0" and allocated to the exclusive-use circuit when the calculation result equals to or falls below "0" is previously defined.

Under the rule, it is decided that the process of the module 1001 is executed in the exclusive-use circuit because the calculation result is "0" and the process of the module 1016 is executed in the programmable logic because the calculation result is "4". The calculation formula is not limited to the foregoing example. The calculation result obtained in the present embodiment is shown in FIG. 23.

Next, the applications 1000 and 1010 are divided per module, and the descriptions of the respective modules are allocated to Steps 2050 and 2060, which will be described later, based on the foregoing calculation result.

The Step 2050 is in charge of a designing step for realizing the modules allocated in the Step 2040 by means of the exclusive-use circuit. For example, the circuit is finished by means of a method such as logic synthesis based on the RTL descriptions.

The Step 2060 is in charge of a designing step for realizing the modules allocated in the Step 2040 by means of the programmable logic. For example, the designer creates a program in which a particular programmable logic can be interpreted based on the specifics of the processes in the modules.

In the foregoing manner, each module constituting the application can be allocated to the suitable circuit based on the data dependency and the similarity of the relevant process used as inputted conditions. In other words, the module in which the process does not depend on the data volume and the similarity is high is allocated to the exclusive-use circuit so that the circuit area can be minimized. On the contrary, in the case of the module in which the process depends on the data volume and the similarity is low, a flexible response to the change is realized by merely rewriting the program in the programmable logic. As described, because the area reduction is realized and the remake of the circuit is unnecessary, the manufacturing cost can be curtailed.

Embodiment 7

Hereinafter, a method of configuring an information processing system according to an embodiment 7 of the present invention is described referring to FIGS. 24 through 27. FIGS. 10A and 10B are applied as examples of the application.

In Step 2410, the designer describes an application by means of a drawing or a language. For example, the description is carried out in a plurality of modules by means of the high-level language such as the C language or RTL.

Figure 25:
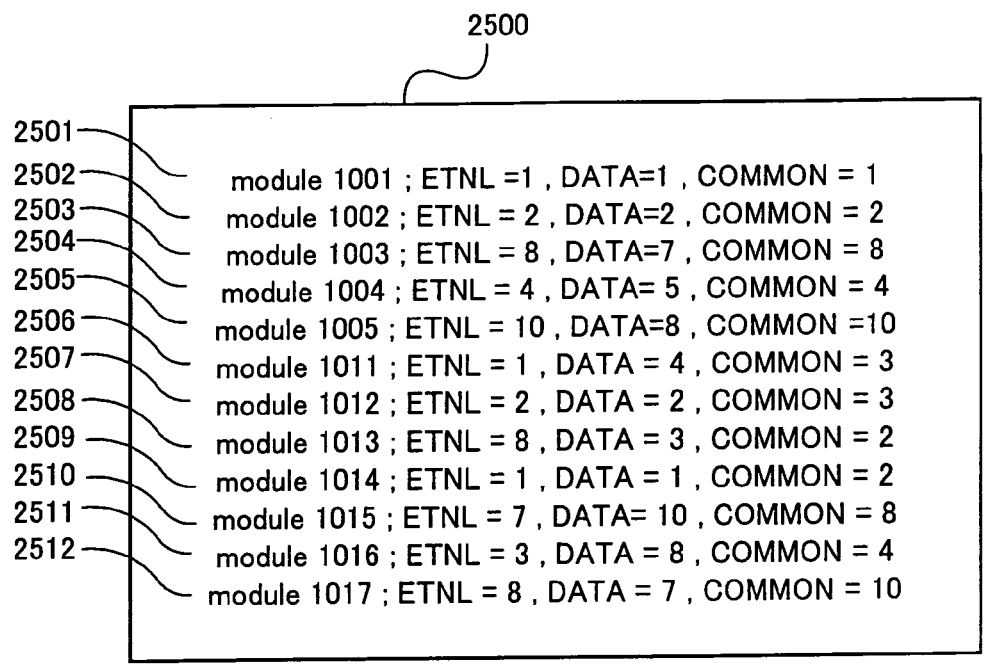
FIG. 25 is a block diagram of a file including respective continuity parameters, data-dependency parameters and similarity parameters according to the embodiment 7.
Figure 26:
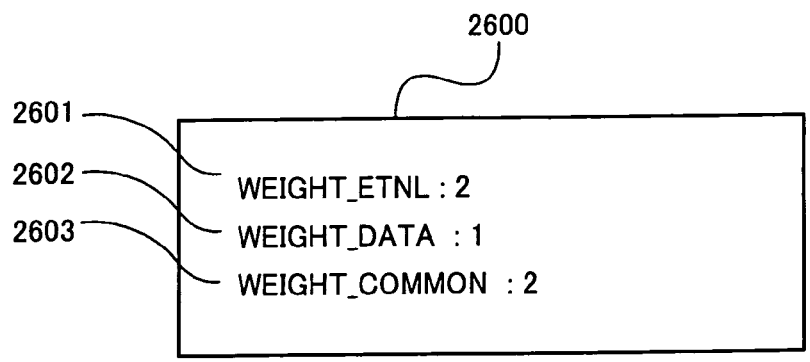
FIG. 26 is a block diagram of a file including weights of the continuity, data dependency and similarity according to the embodiment 7.
Figure 28:
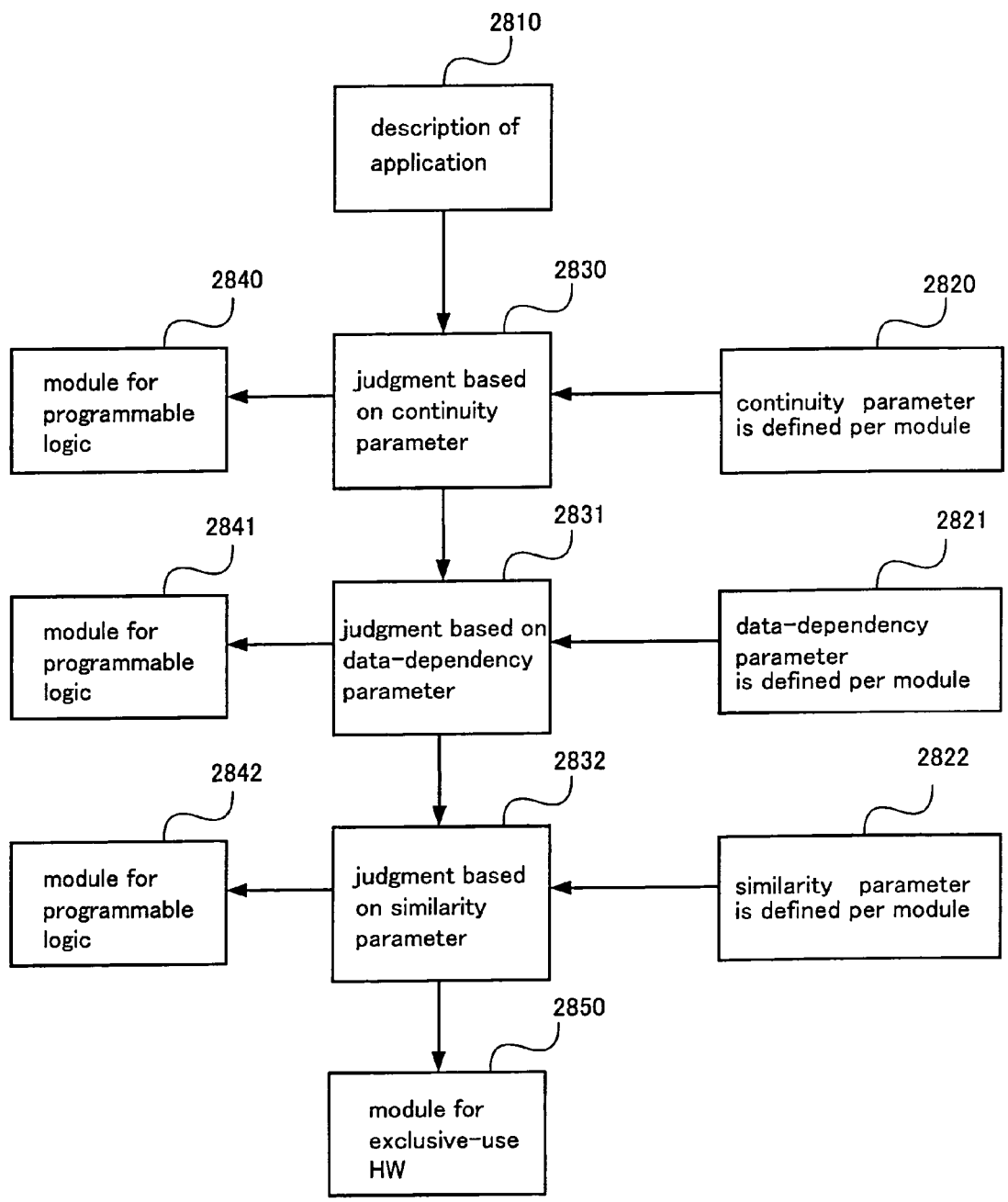
FIG. 28 is a flow chart illustrating a method of configuring an information processing system according to an embodiment 8 of the present invention.

In Step 2420, the continuity parameter, data-dependency parameter and similarity parameter are inputted for each module in the following manner. As shown in FIG. 25, the designer creates a file 2500 in which names of the respective modules and the continuity, data-dependency and similarity parameters of the modules are made to respectively correspond to each other. A notation "module1001;ETNL=1, DATA=1,COMMON=1" in a defining part 2501 written in the file 2500 denotes that the continuity, data-dependency and similarity parameters in a module 1001 (representing despreading in the present embodiment) are respectively "1".

A notation "module1014;ETNL=1,DATA=1,COMMON=2" in a defining part 2509 denotes that the continuity, data-dependency and similarity parameters in a module 1014 (representing FFT in the present embodiment) are respectively "1", "1" and "2". The description as above is carried out to all of the modules constituting the applications 1000 and 1010. The notations of the continuity, data-dependency and similarity parameters are not limited to the before-mentioned examples in the present embodiment.

In Step 2430, weights of the continuity, data-dependency and similarity parameters are defined. For example, as shown in a file 2600 of FIG. 26, a notation "WEIGHT_ETNL:2" in a defining part 2601 denotes that the weight of the continuity parameter is "2". A notation "WEIGHT_DATA:1" in a defining part 2602 denotes that the weight of the data-dependency parameter is "1". A notation "WEIGHT_COMMON:2" in a defining part 2603 denotes that the weight of the similarity parameter is "2". The weights of the continuity, data-dependency and similarity parameters are not limited to the before-mentioned examples in the present embodiment.

In Step 2440, it is judged if the processes of the modules described in the Step 2410 are to be executed by means of the programmable logic or the exclusive-use circuit based on the information relating to the continuity, data dependency and similarity defined in the Step 2420 and the weights of the continuity, data dependency and similarity defined in the Step 2430. First, a calculation is carried out in a predetermined calculation formula using the continuity parameters (ETNL), data-dependency parameters (DATA) and similarity parameters (COMMON) described in the defining parts of the file 2500 and the weight of the continuity parameter (WEIGHT_ETNL), weight of the data-dependency parameter (WEIGHT_DATA) and weight of the similarity parameter (WEIGHT_COMMON) described in the defining parts of the file 2600 as elements. Then, it is judged if a result of the calculation is larger or smaller than a predetermined numeral value.

An example of the calculation formula used here is (ETNL×WEIGHT_ETNL+DATA×WEIGHT_DATA−COMMON×WEIGHT_COMMON). In the foregoing formula, the continuity and the data dependency are added, from which the similarity is subtracted.

For example, it is assumed the rule that the module is allocated to the programmable logic when the calculation result exceeds "0" and allocated to the exclusive-use circuit when the calculation result equals to or falls below "0" is previously defined.

Under the rule, it is decided that the module 1001 is allocated to the programmable logic because the calculation result is "1" and the module 1014 is allocated to the exclusive-use circuit because the calculation result is "−1". The calculation formula is not limited to the foregoing example. The calculation result obtained in the present embodiment is shown in FIG. 27.

Next, the applications 1000 and 1010 are divided per module, and the descriptions of the respective modules are allocated to Steps 2450 and 2460, which will be described later, based on the foregoing calculation result.

The Step 2450 is in charge of a designing step for realizing the modules allocated in the Step 2440 in the exclusive-use circuit. For example, the circuit is finished by means of a method such as logic synthesis based on the RTL descriptions.

The Step 2460 is in charge of a designing step for realizing the modules allocated in the Step 2440 in the programmable logic. For example, the designer creates a program in which a particular programmable logic can be interpreted based on the specifics of the processes in the modules.

In the foregoing manner, each module constituting the application can be allocated to the suitable circuit based on the continuity, data dependency and similarity of the relevant process used as inputted conditions. In other words, the module in which the necessity of the process change is low, there is no data dependency and the similarity is high is allocated to the exclusive-use circuit, and the circuit area can be thereby minimized. On the contrary, in the case of the module in which the necessity of the process change is high, the data dependency is high and the similarity is low, a flexible response to the change is realized by merely rewriting the program in the programmable logic. As described, because the area reduction is realized and the remake of the circuit is unnecessary, the manufacturing cost can be curtailed.

Embodiment 8

Hereinafter, a method of configuring an information processing system according to an embodiment 8 of the present invention is described referring to FIGS. 28 through 34. FIGS. 10A and 10B are applied as examples of the application.

In Step 2810, the designer describes an application by means of a drawing or a language. For example, the description is carried out in a plurality of modules by means of the high-level language such as the C language or RTL.

Figure 29:
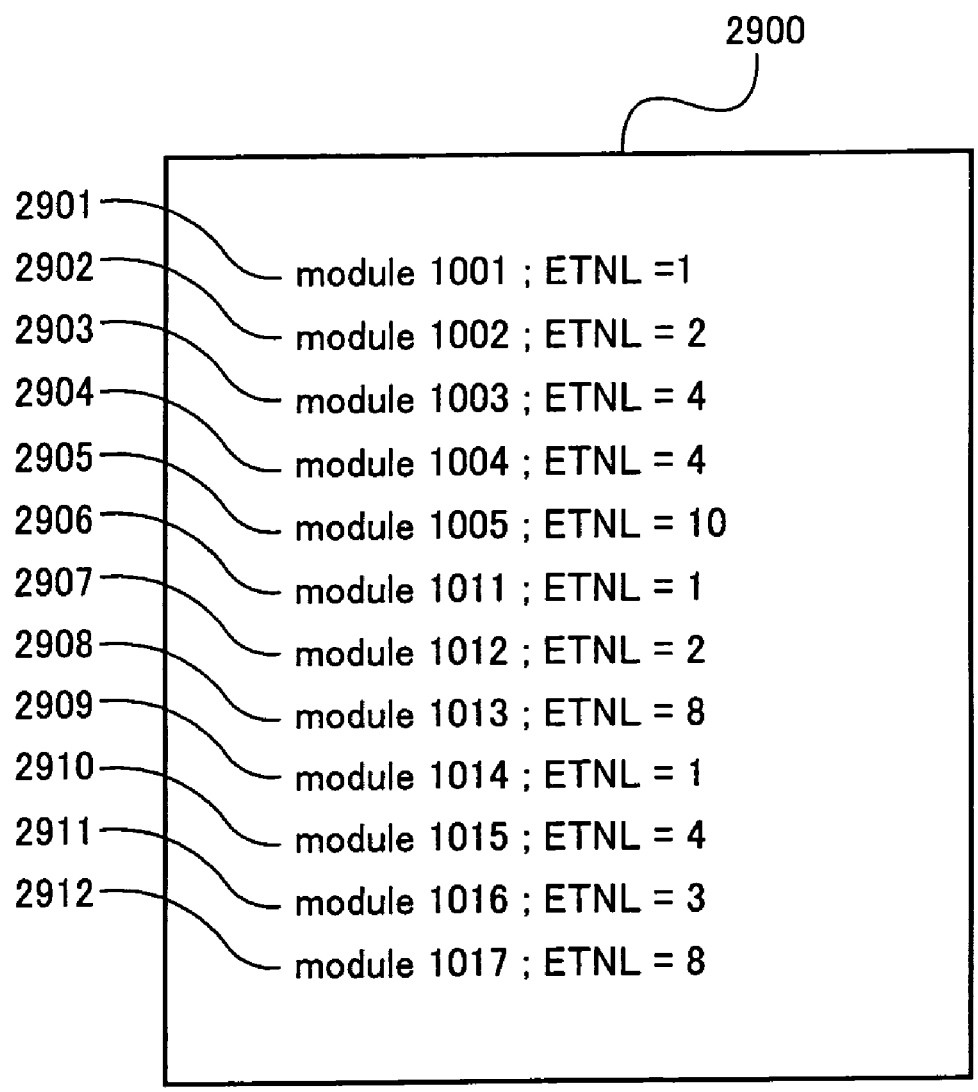
FIG. 29 is a block diagram of a file including continuity parameters according to the embodiment 8.

In Step 2820, the continuity parameter is inputted for each module in the following manner. As shown in FIG. 29, the designer creates a file 2900 in which names of the respective modules and the continuity parameters of the modules are made to respectively correspond to each other. A notation "module1001;ETNL=1" in a defining part 2901 written in the file 2900 denotes that the continuity parameter in a module 1001 (representing despreading in the present embodiment) is "1".

A notation "module1005;ETNL=10" in a defining part 2905 denotes that the continuity parameter in a module 1005 (representing Viterbi decoding of CDMA communication in the present embodiment) is "10". The description as above is carried out to all of the modules constituting the applications 1000 and 1010.

Figure 30:
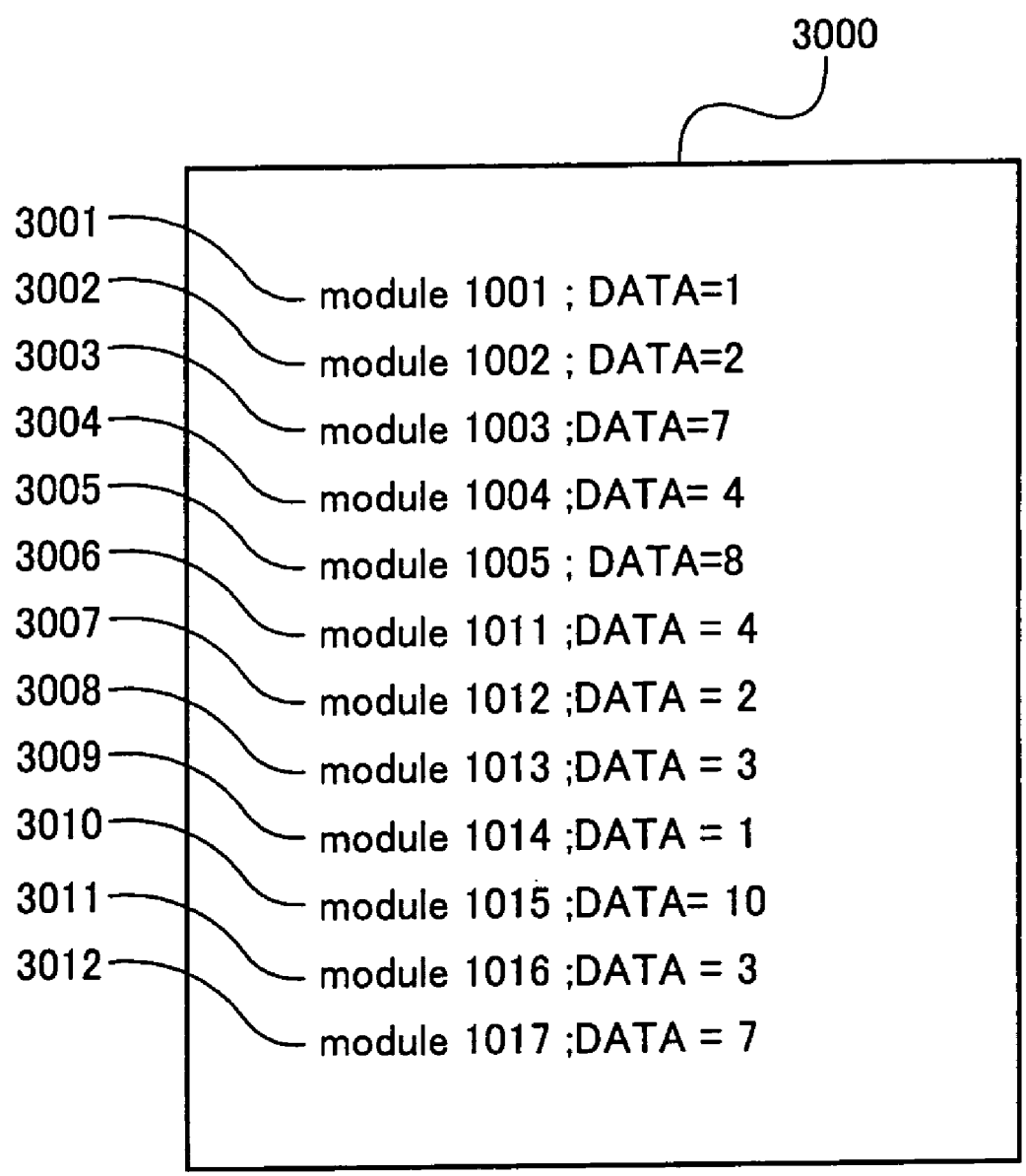
FIG. 30 is a block diagram of a file including data-dependency parameters according to the embodiment 8.

In Step 2821, the data-dependency parameter is inputted for each module in the following manner. As shown in FIG. 30, the designer creates a file 3000 in which names of the respective modules and the data-dependency parameters of the modules are made to respectively correspond to each other.

A notation "module1001;DATA=1" in a defining part 3001 written in the file 3000 denotes that the data-dependency parameter in a module 1001 (representing despreading in the present embodiment) is "1".

A notation "module1003;DATA=7" in a defining part 3003 denotes that the data-dependency parameter in a module 1003 is "7". The description as above is carried out to all of the modules constituting the applications 1000 and 1010.

Figure 31:
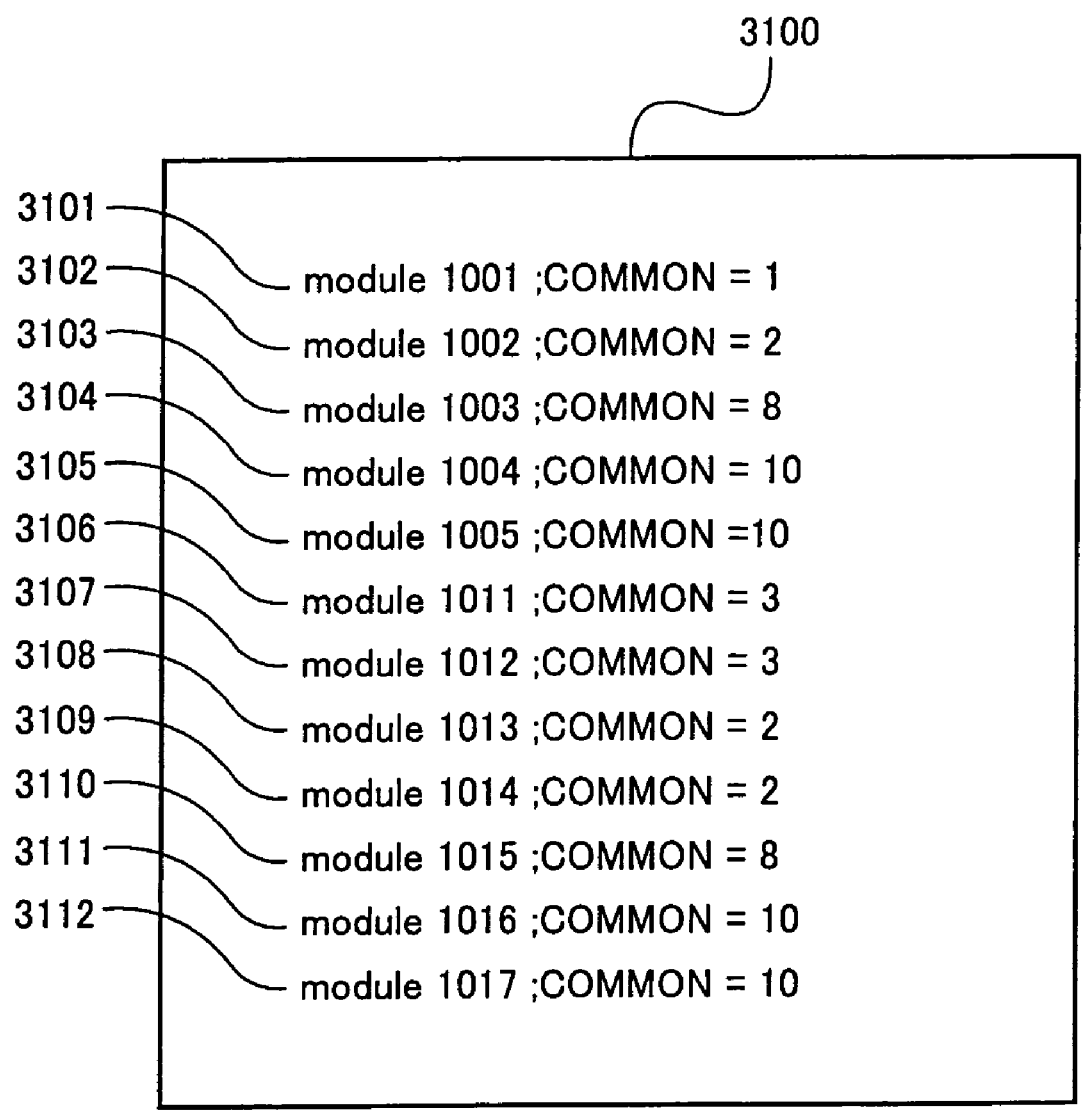
FIG. 31 is a block diagram of a file including similarity parameters according to the embodiment 8.
Figure 35:
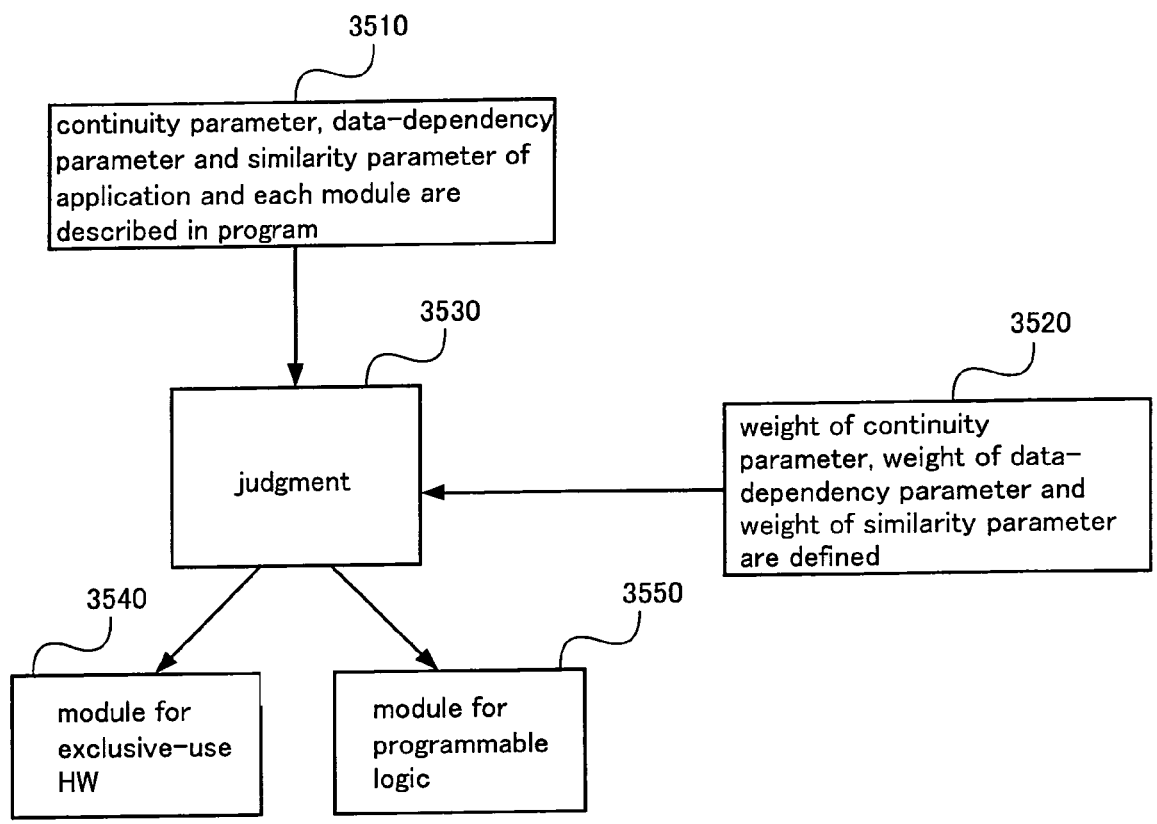
FIG. 35 is a flow chart illustrating a method of configuring an information processing system according to an embodiment 9 of the present invention.
Figure 37:
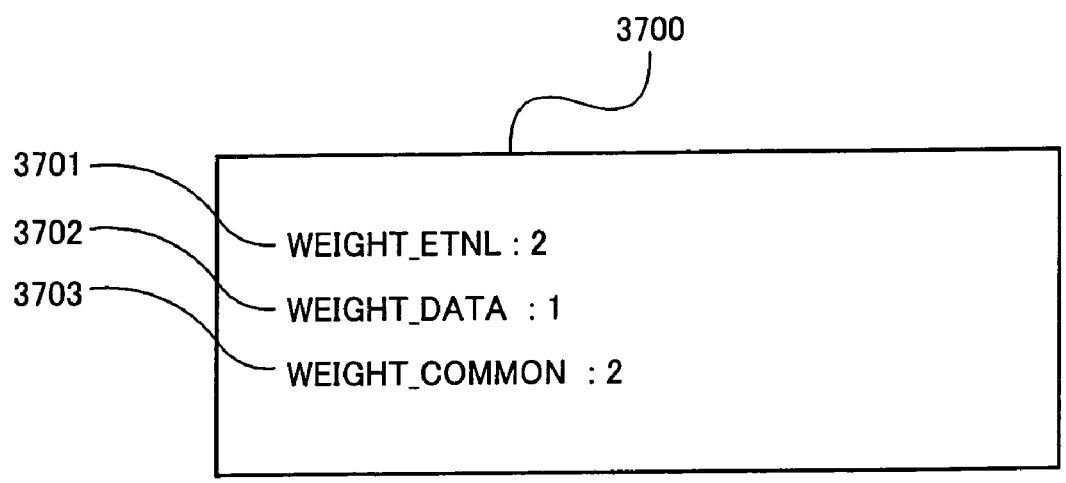
FIG. 37 is a block diagram of a file including weights of the continuity, data dependency and similarity according to the embodiment 9.

In Step 2822, the similarity parameter is inputted for each module in the following manner. As shown in FIG. 31, the designer creates a file 3100 in which names of the respective modules and the similarity parameters of the modules are made to respectively correspond to each other.

A notation "module1001;COMMON=1" in a defining part 3101 written in the file 3100 denotes that the similarity parameter in a module 1001 (representing despreading in the present embodiment) is "1".

A notation "module1016;COMMON=10" in defining-part3011 denotes that the similarity parameter in a module 1016 is "10". The description as above is carried out to all of the modules constituting the applications 1000 and 1010.

In Step 2830, it is judged if the processes of the modules described in the Step 2810 are to be executed by means of the programmable logic or passed on to Step 2831, which will be described later, based on the information relating to the continuity defined in the Step 2820. First, it is judged if the continuity parameters (ETNL) described in the defining parts of the file 2900 are larger or smaller than a predetermined numeral value.

For example, it is assumed the rule that the respective module is allocated to the programmable logic when the numeral value of the continuity parameter equals to or exceeds "5", and passed on to the Step 2831 when the numeral value of the continuity parameter is less than "5" is previously defined. Under the rule, it is decided that the module 1001 proceeds to the Step 2831 with the judgment result of "1", and the process of the module 1005 is executed by means of the programmable logic with the judgment result of "10". The judgment result obtained in the present embodiment is shown in FIG. 32.

Next, the applications 1000 and 1010 are divided per module, and the descriptions of the respective modules are allocated to Steps 2840 and 2831, which will be described later, based on the foregoing calculation result.

In Step 2831, it is judged if the processes of the modules described in the Step 2810 are to be executed by means of the programmable logic or passed on to Step 2832, which will be described later, based on the information relating to the data dependency defined in the Step 2821. First, it is judged if the data-dependency parameters (DATA) described in the defining parts of the file 3000 are larger or smaller than a predetermined numeral value.

For example, it is assumed the rule that the module is allocated to the programmable logic when numeral value of the data-dependency parameter equals to or exceeds "5", and passed on to the Step 2832 when the numeral value is less than "5" is previously defined. Under the rule, it is decided that the module 1001 proceeds to the Step 2832 because of the judgment result of "1", and the module 1003 is to be processed by the programmable logic because of the judgment result of "7". The judgment result is shown in FIG. 33.

Next, the applications 1000 and 1010 are divided per module, and the descriptions of the respective modules are allocated to Steps 2841 and 2832, which will be described later, based on the foregoing judgment result.

In Step 2832, it is judged if the processes of the modules described in the Step 2810 are to be executed by means of the programmable logic or the exclusive-use hardware based on the information relating to the similarity defined in the Step 2822. First, it is judged if the similarity parameters (COMMON) described in the defining parts of the file 3100 are larger or smaller than a predetermined numeral value.

For example, it is assumed the rule that the respective module is allocated to the exclusive-use circuit when the numeral value equals to or exceeds "5", and passed on to the programmable logic when the numeral value is less than "5" is previously defined. Under the rule, it is decided that the module 1001 is handled by means of the programmable logic because of the judgment result of "1", and the module 1016 is processed by means of the exclusive-use hardware because of the judgment result of "10". The judgment result is shown in FIG. 34.

Next, the applications 1000 and 1010 are divided per module, and the descriptions of the respective modules are allocated to Steps 2842 and 2850, which will be described later, based on the foregoing judgment result.

The Step 2840 is in charge of a designing step for realizing the modules allocated in the Step 2830 in the programmable logic. For example, the designer creates a program in which a particular programmable logic can be interpreted based on the specifics of the processes in the modules.

The Step 2841 is in charge of a designing step for realizing the modules allocated in the Step 2831 in the programmable logic. For example, the designer creates a program in which a particular programmable logic can be interpreted based on the specifics of the processes in the modules.

The Step 2842 is in charge of a designing step for realizing the modules allocated in the Step 2832 in the programmable logic. For example, the designer creates a program in which a particular programmable logic can be interpreted based on the specifics of the processes in the modules.

The Step 2850 is in charge of a designing step for realizing the modules allocated in the Step 2832 in the exclusive-use circuit. For example, the circuit is finished by means of a method such as logic synthesis based on the RTL descriptions.

In the foregoing manner, each module constituting the application can be allocated to the suitable circuit based on the continuity, data dependency and similarity of the relevant process used as inputted conditions. In other words, the module in which the necessity of the process change is low, there is no data dependency and the similarity is high is allocated to the exclusive-use circuit, and the circuit area can be thereby minimized. On the contrary, in the case of the module in which the necessity of the process change is high, the data dependency is high and the similarity is low, a flexible response to the change is realized by merely rewriting the program in the programmable logic. As described, because the area reduction is realized and the remake of the circuit is unnecessary, the manufacturing cost can be curtailed.

Embodiment 9

Hereinafter, a method of configuring an information processing system according to an embodiment 9 of the present invention is described referring to FIGS. 35 through 38. FIGS. 10A and 10B are applied as examples of the application.

In Step 3510, the designer describes an application by means of a language, for example, the high-level language such as C language. The description is carried out in a language for each module shown in FIGS. 10A and 10B.

The continuity, data-dependency and similarity parameters are entered for each module. For example, a notation ⌈a1001( );/*ETNL=2,DATA=1,COMMON=8*/⌋ is written in a module calling part of a module 1001 as shown in FIG. 36A. ⌈a1001( );⌋ corresponds to a calling part of a module a1001 (despreading 1001) in an application A (CDMA communication 1000 in the present embodiment). ⌈/*ETNL=2,DATA=1, COMMON=8*/⌋ denotes that the continuity parameter "ETNL" is "2", the data-dependency parameter "DATA" is "1", and the similarity parameter "COMMON" is "8".

In the foregoing manner, the continuity, data-dependency and similarity parameters are described in each module constituting the applications 1000 and 1010.

In Step 3520, weights of the continuity, data-dependency and similarity parameters are defined. For example, as shown in a file 3700 of FIG. 37, a notation "WEIGHT_ETNL:2" in a defining part 3701 denotes that the weight of the continuity parameter is "2". A notation "WEIGHT_DATA:1" in a defining part 3702 denotes that the weight of the data-dependency parameter is "1". A notation "WEIGHT_COMMON:2" in a defining part 3703 denotes that the weight of the similarity parameter is "2". The weights of the continuity, data-dependency and similarity parameters are not limited to the before-mentioned examples in the present embodiment.

In Step 3530, it is judged if the processes of the modules are to be executed by means of the programmable logic or the exclusive-use circuit based on the information relating to the continuity, data dependency and similarity defined in the Step 3510 and the weights of the continuity, data dependency and similarity defined in the Step 3520. First, a calculation is carried out in a predetermined calculation formula using the continuity parameters (ETNL), the data-dependency parameters (DATA) and the similarity parameters (COMMON) described in the file 3610 and the weight of the continuity parameter (WEIGHT_ETNL), the weight of the data-dependency parameter (WEIGHT_DATA) and the weight of the similarity parameter (WEIGHT_COMMON) described in the defining parts of the file 3700 as elements. Then, it is judged if a result of the calculation is larger or smaller than a predetermined numeral value.

An example of the calculation formula used here is (ETNL×WEIGHT_ETNL+DATA×WEIGHT_DATA−COMMON×WEIGHT_COMMON).

For example, it is assumed the rule that the module is allocated to the programmable logic when the calculation result exceeds "0" and allocated to the exclusive-use circuit when the calculation result falls below "0" is previously defined.

Under the rule, it is decided that the module 1001 is allocated to the exclusive-use circuit because the calculation result is "−11" and the module 1005 is allocated to the programmable logic because the calculation result is "15". The calculation formula is not limited to the foregoing example. The calculation result obtained in the present embodiment is shown in FIG. 38.

Next, the applications 1000 and 1010 are divided per module, and the descriptions of the respective modules are allocated to Steps 3540 and 3550, which will be described later, based on the foregoing calculation result.

The Step 3540 is in charge of a designing step for realizing the modules allocated in the Step 3530 in the exclusive-use circuit. For example, the circuit is finished by means of a method such as logic synthesis based on the RTL descriptions.

The Step 3550 is in charge of a designing step for realizing the modules allocated in the Step 3530 in the programmable logic. For example, the designer creates a program in which a particular programmable logic can be interpreted based on the specifics of the processes in the modules.

In the foregoing manner, each module constituting the application can be allocated to the suitable circuit based on the continuity, data dependency and the similarity of the relevant process used as inputted conditions. In other words, the module in which the necessity of the process change is low, there is no data dependency and the similarity is high is allocated to the exclusive-use circuit. Accordingly, a minimum circuit area can be achieved. On the contrary, in the case of the module in which the necessity of the process change is high, the data dependency is high and the similarity is low, a flexible response to the change is realized by merely rewriting the program in the programmable logic. As described, because the area reduction is realized and the remake of the circuit is unnecessary, the manufacturing cost can be curtailed.

Embodiment 10

Figure 39:
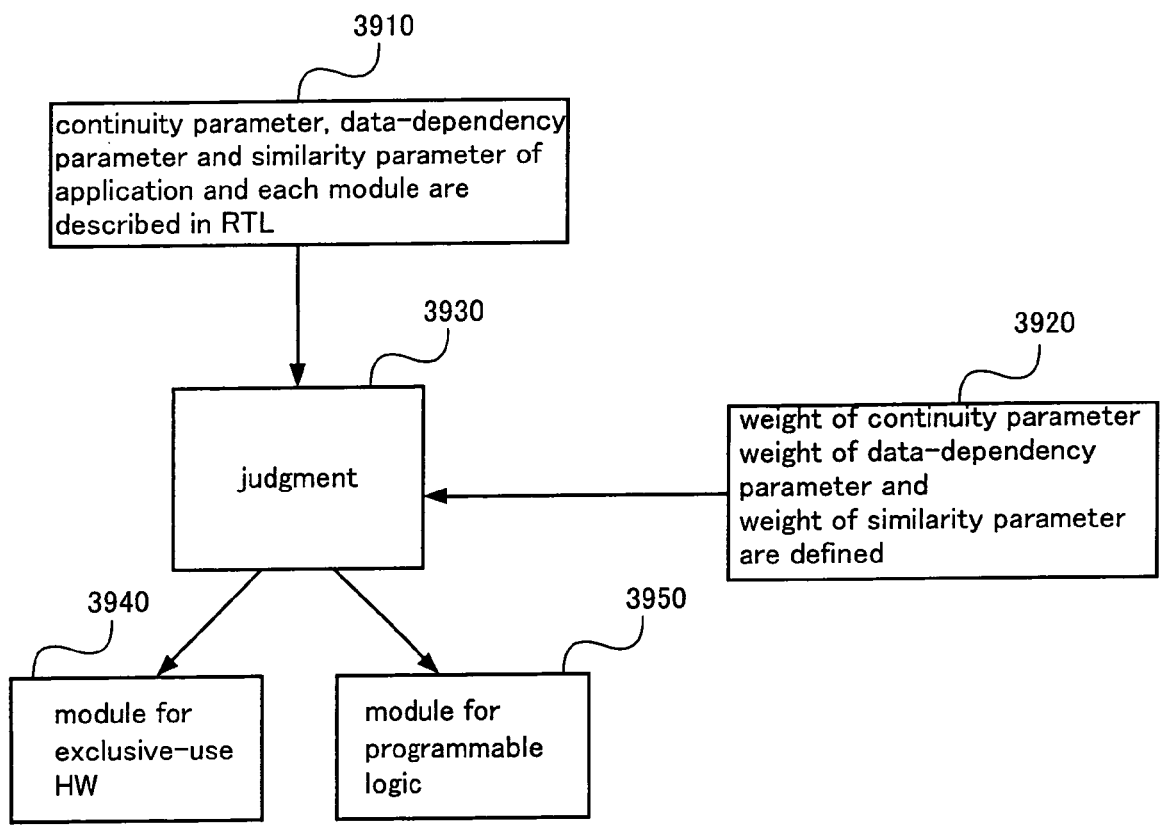
FIG. 39 is a flow chart illustrating a method of configuring an information processing system according to an embodiment 10 of the present invention.

Hereinafter, a method of configuring an information processing system according to an embodiment 10 of the present invention is described referring to FIGS. 39 through 41.

In Step 3910, the designer describes an application by means of a circuit description language such as the RTL, examples of which are shown in FIGS. 40A, 40B and 40C. The description is carried out by means of a language for each module.

The continuity, data-dependency and similarity parameters are entered for each module. For example, a notation [a1 a1(.clock (clock),.reset(reset),. . . . );/*ETNL=10,DATA=1, COMMON=1*/) is written in a module calling part of a module a1 as shown in FIG. 40A, which denotes that the continuity parameter "ETNL" of the module a1 is "10", and the data-dependency parameter "DATA" and the similarity parameter "COMMON" therein are respectively "1". In the foregoing manner, the continuity, data-dependency and similarity parameters are described in each module constituting the application.

In Step 3920, weights of the continuity, data-dependency and similarity parameters are defined. For example, as shown in the file 3700 of FIG. 37, the notation "WEIGHT_ETNL:2" in the defining part 3701 denotes that the weight of the continuity parameter is "2". The notation "WEIGHT_DATA:1" in the defining part 3702 denotes that the weight of the data-dependency parameter is "1". The notation "WEIGHT_COMMON:2" in the defining part 3703 denotes that the weight of the similarity parameter is "2". The weights of the continuity, data-dependency and similarity parameters are not limited to the before-mentioned examples in the present embodiment.

In Step 3930, it is judged if the processes of the modules are to be executed by means of the programmable logic or the exclusive-use circuit based on the information relating to the continuity, data-dependency and similarity defined in the Step 3910 and the weights of the continuity, data-dependency and similarity defined in the Step 3920. First, a calculation is carried out in a predetermined calculation formula using the continuity parameters (ETNL), the data-dependency parameters (DATA) and the similarity parameters (COMMON) described in files 4010, 4020 and 4030 and the weight of the continuity parameter (WEIGHT_ETNL), the weight of the data-dependency parameter (WEIGHT_DATA) and the weight of the similarity parameter (WEIGHT_COMMON) described in the defining parts of the file 3700 as elements. Then, it is judged if a result of the calculation is larger or smaller than a predetermined numeral value.

The calculation formula here is hypothetically (ETNL× WEIGHT_ETNL+DATA×WEIGHT_DATA−COMMON× WEIGHT_COMMON).

For example, it is assumed the rule that the module is allocated to the programmable logic when the calculation result exceeds "0" and allocated to the exclusive-use circuit when the calculation result falls below "0" is previously defined.

Under the rule, it is decided that a module a3 is processed by means of the exclusive-use circuit because the calculation result is "−17" and the module a1 is processed by means of the programmable logic because the calculation result is "19". The calculation formula is not limited to the foregoing example. The calculation result obtained in the present embodiment is shown in FIG. 41.

Next, the application is divided per module, and the descriptions of the respective modules are allocated to Steps 3940 and 3950, which will be described later, based on the foregoing calculation result.

The Step 3940 is in charge of a designing step for realizing the modules allocated in the Step 3930 in the exclusive-use circuit. For example, the circuit is finished by means of a method such as logic synthesis based on the RTL descriptions.

The Step 3950 is in charge of a designing step for realizing the modules allocated in the Step 3930 in the programmable logic. For example, the designer creates a program in which a particular programmable logic can be interpreted based on the specifics of the processes in the modules.

In the foregoing manner, each module constituting the application can be allocated to the suitable circuit based on the continuity, data dependency and the similarity of the relevant process used as input conditions. In other words, the module in which the necessity of the process change is low, there is no data dependency and the similarity is high is allocated to the exclusive-use circuit. Accordingly, a minimum circuit area can be achieved. On the contrary, in the case of the module in which the necessity of the process change is high, the data dependency is high and the similarity is low, a flexible response to the change is realized by merely rewriting the program in the programmable logic. As described, because the area reduction is realized and the remake of the circuit is unnecessary, the manufacturing cost can be curtailed.

Embodiment 11

Figure 42:
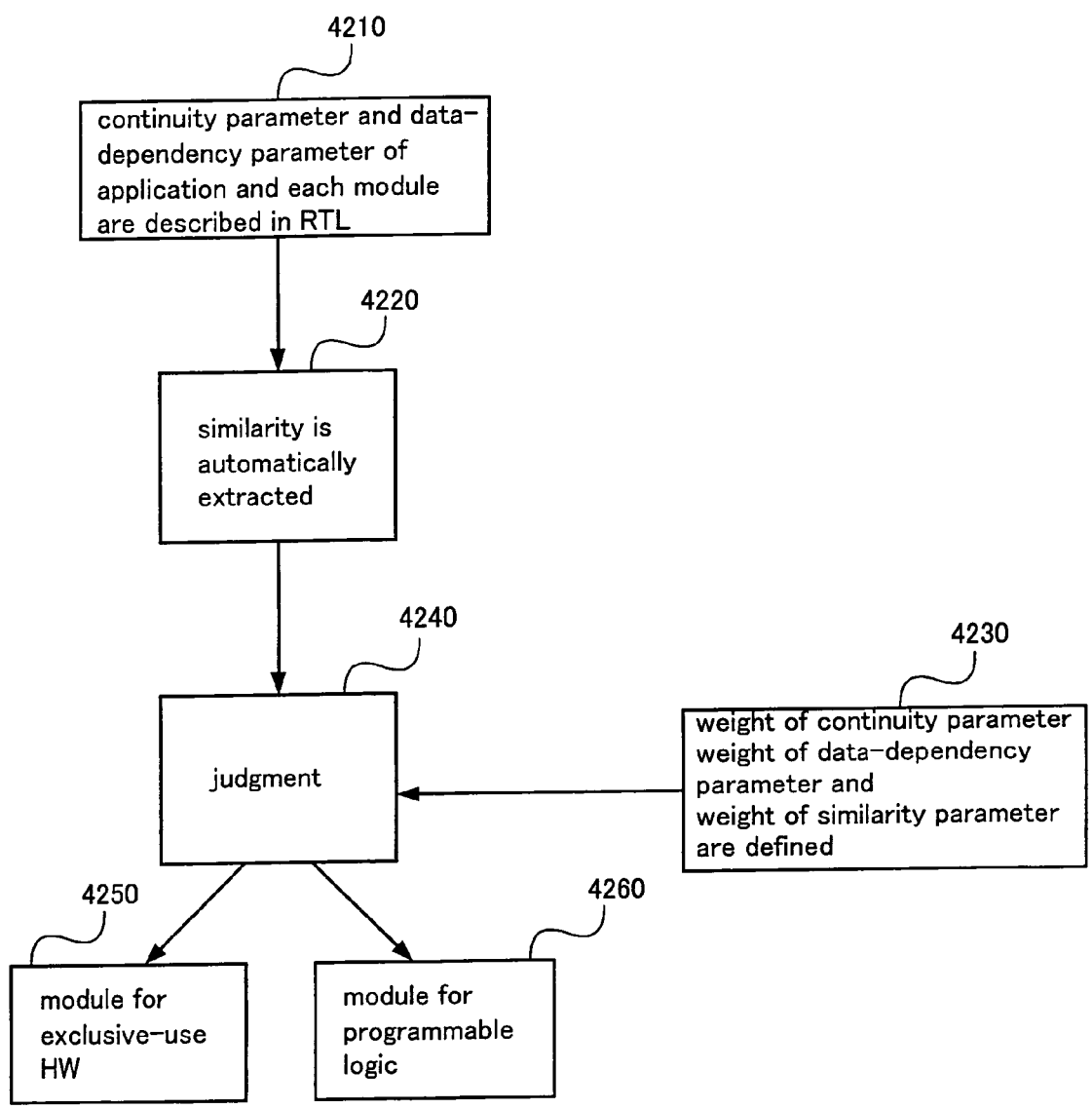
FIG. 42 is a flow chart illustrating a method of configuring an information processing system according to an embodiment 11 of the present invention.

Hereinafter, a method of configuring an information processing system according to an embodiment 11 of the present invention is described referring to FIGS. 42 through 44.

In Step 4210, the designer describes an application by means of a circuit description language such as the RTL, examples of which are shown in FIGS. 43A, 43B and 43C. The description is carried out by means of a language for each module.

The continuity parameter and the data-dependency parameter are entered for each module. For example, a notation [a1 a1(.clock(clock),.reset(reset) . . . );/*ETNL=10, DATA=1*/] is written in a module calling part of a module a1 as shown in FIG. 43A, which denotes that the continuity parameter "ETNL" of the module a1 is "10" and the data-dependency parameter "DATA" therein is "1". In the foregoing manner, the continuity parameter and the data-dependency parameter are described in each module constituting the application.

In Step 4220, a level of commonality in the used circuits is extracted for each module in the form of the similarity parameter from the RTL described in the Step 4210. For example, in the modules a3, b3 and c3 shown in FIGS. 43A, 43B and 43C, the similarity is judged to be "10" because the circuits respectively used are exactly the same as shown in 4311, 4321 and 4331. The similarity parameter is "1" in the absence of commonality in the case of the modules a1, a2, b1, b2, c1 and c2.

In Step 4230, weights of the continuity and data-dependency parameters and a weight of the extracted similarity parameter are defined in the same manner as in the file 3700.

In Step 4340, it is judged if the processes of the respective modules are to be executed by means of the programmable logic or the exclusive-use circuit based on the information relating to the continuity and data-dependency defined in the Step 4210, the information relating to the similarity extracted in the Step 4220 and the weights of the continuity, data-dependency and similarity parameters defined in the Step 4230. First, a calculation is carried out in a predetermined calculation formula using the continuity parameters (ETNL) and the data-dependency parameters (DATA) described in files 4310, 4320 and 4330, the similarity parameters (COMMON) extracted in the Step 4320, and the weight of the continuity parameter (WEIGHT_ETNL), the weight of the data-dependency parameter (WEIGHT_DATA) and the weight of the similarity parameter (WEIGHT_COMMON) described in the defining parts of the file 3700 as elements. Then, it is judged if a result of the calculation is larger or smaller than a predetermined numeral value.

The calculation formula here is hypothetically (ETNL× WEIGHT_ETNL+DATA×WEIGHT_DATA−COMMON× WEIGHT_COMMON).

For example, it is assumed the rule that the module is allocated to the programmable logic when the calculation result exceeds "0" and allocated to the exclusive-use circuit when the calculation result falls below "0" is previously defined.

Under the rule, it is decided that the module a3 is processed by means of the exclusive-use circuit because the calculation result is "−17" and the module a1 is processed by means of the programmable logic because the calculation result is "19". The calculation formula is not limited to the foregoing example. The calculation result obtained in the present embodiment is shown in FIG. 44.

Next, the application is divided per module, and the descriptions of the respective modules are allocated to Steps 4250 and 4260, which will be described later, based on the foregoing calculation result.

The Step 4250 is in charge of a designing step for realizing the modules allocated in the Step 4240 in the exclusive-use circuit. For example, the circuit is finished by means of a method such as logic synthesis based on the RTL descriptions.

The Step 4260 is in charge of a designing step for realizing the modules allocated in the Step 4240 in the programmable logic. For example, the designer creates a program in which a particular programmable logic can be interpreted based on the specifics of the processes in the modules.

In the foregoing manner, each module constituting the application can be allocated to the suitable circuit based on the continuity, data dependency and the similarity of the relevant process used as inputted conditions. In other words, the module in which the necessity of the process change is low, there is no data dependency and the similarity is high is allocated to the exclusive-use circuit, and the circuit area can be thereby minimized. On the contrary, in the case of the module in which the necessity of the process change is high, the data dependency is high and the similarity is low, a flexible response to the change is realized by merely rewriting the program in the programmable logic. As described, because the area reduction is realized and the remake of the circuit is unnecessary, the manufacturing cost can be curtailed.

Embodiment 12

Figure 45:
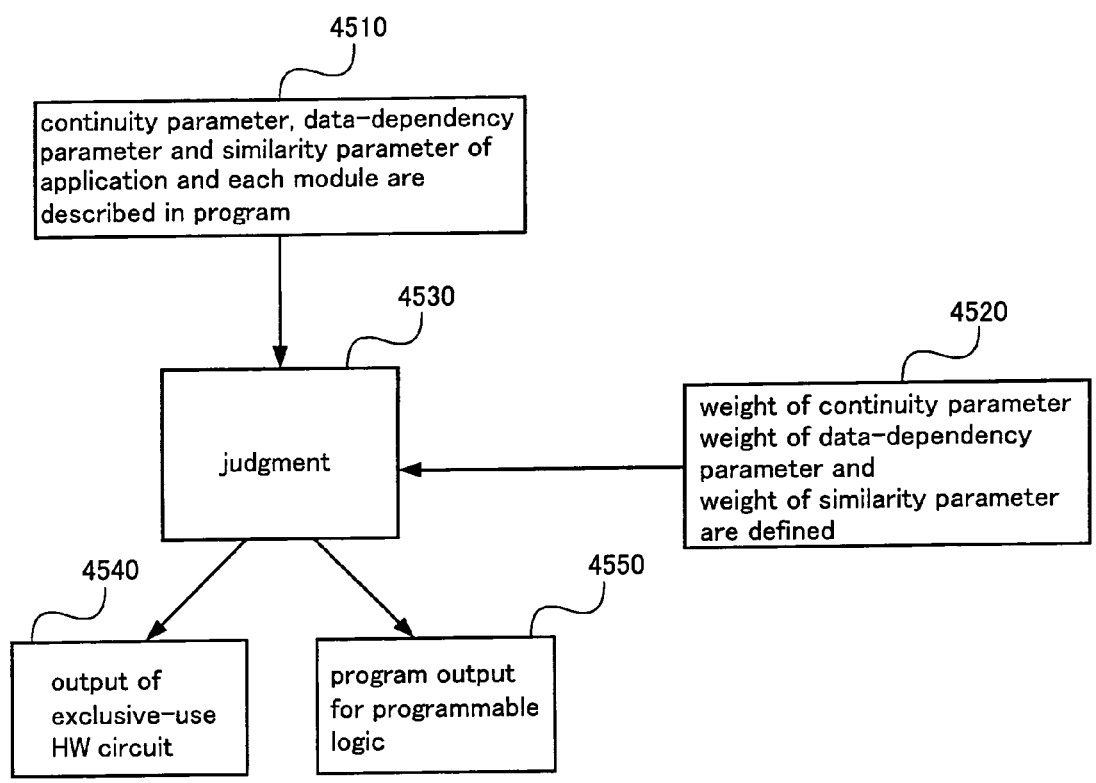
FIG. 45 is a flow chart illustrating a method of configuring an information processing system according to an embodiment 12 of the present invention.

Hereinafter, a method of configuring an information processing system according to an embodiment 12 of the present invention is described referring to FIG. 45. In FIG. 45, Steps 4510, 4520 and 4530 conform to the steps in the embodiment 9.

In Step 4540, the modules allocated in the Step 4530 are converted into a net list of a gate level and then outputted.

In Step 4550, a program in which the programmable logic can be interpreted based on the modules allocated in the Step 4530 is outputted.

In the foregoing manner, each module constituting the application can be allocated to the suitable circuit based on the continuity, data dependency and the similarity of the relevant process used as inputted conditions. In other words, the module in which the necessity of the process change is low, there is no data dependency and the similarity is high is allocated to the exclusive-use circuit so that the circuit area can be minimized. On the contrary, in the case of the module in which the necessity of the process change is high, the data dependency is high and the similarity is low, a flexible response to the change is realized by merely rewriting the program in the programmable logic. As described, because the area reduction is realized and the remake of the circuit is unnecessary, the manufacturing cost can be curtailed.

The present invention is not limited to the embodiments described so far, and can be implemented in various modifications within the scope of its technical idea.

As thus far described, according to the present invention, the area-utilizing efficiency can be increased and the application process can be flexibly executed in a minimum chip area according to the constitutions and methods recited so far. As a result, the manufacturing cost can be successfully curtailed.

The method of configuring the semiconductor integrated circuit and the semiconductor integrated circuit according to the present invention can be effectively used in an extended period of time while a degree of freedom is being secured, and further, can effectively curtail the manufacturing cost. The technology is advantageous as a development tool of the semiconductor.

What is claimed is:

1. A method of designing an information processing system utilizing a processor, said information processing system comprising a programmable logic hardware and an exclusive-use hardware, and executing one or more applications, said method comprising:

utilizing a processor, obtaining parameters representing invariability corresponding to each module of the one or more applications;

comparing the parameters representing invariability to a boundary condition;

allocating some modules to the programmable logic hardware and the other modules to the exclusive-use hardware based on a result of the comparison;

designing the programmable logic hardware and the exclusive-use hardware based on a result of the allocation; and displaying, storing, or outputting the designs of the programmable logic hardware and the exclusive-use hardware.

2. The method of designing the information processing system as claimed in claim 1, wherein the parameters representing invariability are continuity parameters with respect to the modules.

3. The method of designing the information processing system as claimed in claim 1, wherein the parameters representing invariability are data-dependency parameters with respect to the modules.

4. The method of designing the information processing system as claimed in claim 1, wherein the parameters representing invariability are similarity parameters with respect to the modules.

5. The method of designing the information processing system as claimed in claim 1, further comprising obtaining continuity parameters and data-dependency parameters after obtaining the parameters representing invariability comprising the continuity parameters and the data-dependency parameters, wherein the continuity parameters, the data-dependency parameters and the respective weights thereof are compared to the boundary condition.

6. The method of designing the information processing system as claimed in claim 1, further comprising obtaining continuity parameters and similarity parameters after obtaining the parameters representing invariability comprising the continuity parameters and the similarity parameters, wherein the continuity parameters, the similarity parameters and the respective weights are compared to the boundary condition.

7. The method of designing the information processing system as claimed in claim 1, further comprising obtaining data-dependency parameters and the similarity parameters after obtaining the parameters representing invariability comprising the data-dependency parameters and the similarity parameters, wherein the data-dependency parameters, the similarity parameters and the respective weights are compared to the boundary condition.

8. The method of designing the information processing system as claimed in claim 1 further comprising obtaining continuity parameters, data-dependency parameters and similarity parameters after obtaining the parameters representing invariability comprising the continuity parameters, the data-dependency parameters and the similarity parameters, wherein the continuity parameters, the data-dependency parameters, the similarity parameters and the respective weights are compared to the boundary condition.

9. The method of designing the information processing system as claimed in claim 1, further comprising:

obtaining continuity parameters corresponding to each of the modules as the parameters representing invariability;

obtaining data-dependency parameters corresponding to each of the modules as the parameters representing invariability;

obtaining similarity parameters corresponding to each of the modules as the parameters representing invariability;

comparing the continuity parameters to a first boundary condition, and allocating some modules to the programmable logic hardware in accordance with a result of the comparison based on the continuity parameters and using the other modules as an input in a comparison step based on the data-dependency parameters;

comparing the data-dependency parameters to a second boundary condition, and allocating some modules to the programmable logic hardware in accordance with a result of the comparison based on the data-dependency parameters and using the other modules as an input in a comparison step based on the similarity parameters; and comparing the similarity parameters to a third boundary condition, wherein some modules are allocated to the programmable logic hardware and the other modules are allocated to the exclusive-use hardware in accordance with a result of the comparison based on the similarity parameters.

10. The method of designing the information processing system as claimed in claim 1, wherein:

continuity parameters, data-dependency parameters and similarity parameters are obtained as the parameters representing invariability, by describing in a C-language program modeled for each module of the one or more applications;

weights of the continuity parameters, the data-dependency parameters and the similarity parameters are obtained; and the continuity parameters, the data-dependency parameters, the similarity parameters and the respective weights are compared to the boundary condition.

11. The method of designing the information processing system as claimed in claim 1, wherein:

continuity parameters, data-dependency parameters and similarity parameters are obtained as the parameters representing invariability, by describing in a hardware description language modeled for each module of the one or more applications;

weights of the continuity parameters, the data-dependency parameters and the similarity parameters are obtained; and the continuity parameters, the data-dependency parameters, the similarity parameters and the respective weights are compared to the boundary condition.

12. The method of designing the information processing system as claimed in claim 1, further comprising:

extracting similarity parameters automatically from the one or more applications, wherein:

continuity parameters and data-dependency parameters are obtained as the parameters representing invariability, by describing in a C-language program or a hardware description language modeled for each module of the one or more applications;

weights of the continuity parameters, the data-dependency parameters and the similarity parameters are obtained; and the automatically extracted similarity parameters, the continuity parameters, the data-dependency parameters described and the respective weights are compared to the boundary condition.

13. The method of configuring an information processing system as claimed in claim 10, wherein the programmable logic hardware and the exclusive-use hardware are designed, based on a result of the allocation, a circuit-formation information of the programmable logic hardware and a circuit-formation information of the exclusive-use circuit.

14. A semiconductor integrated circuit comprising the programmable logic hardware and the exclusive-use hardware, which are designed by the method of designing the information processing system as claimed in claim 1.

15. A semiconductor integrated circuit comprising the programmable logic hardware and the exclusive-use hardware, which are designed by the method of designing the information processing system as claimed in claim 2.

16. A semiconductor integrated circuit comprising the programmable logic hardware and the exclusive-use hardware, which are designed by the method of designing the information processing system as claimed in claim 3.

17. A semiconductor integrated circuit comprising the programmable logic hardware and the exclusive-use hardware, which are designed by the method of designing the information processing system as claimed in claim 4.

18. A semiconductor integrated circuit comprising the programmable logic hardware and the exclusive-use hardware, which are designed by the method of designing the information processing system as claimed in claim 8.

19. A semiconductor integrated circuit comprising the programmable logic hardware and the exclusive-use hardware, which are designed by the method of designing the information processing system as claimed in claim 9.

20. A semiconductor integrated circuit comprising the programmable logic hardware and the exclusive-use hardware, which are designed by the method of designing the information processing system as claimed in claim 10.

21. A semiconductor integrated circuit comprising the programmable logic hardware and the exclusive-use hardware, which are designed by the method of designing the information processing system as claimed in claim 12.

22. A semiconductor integrated circuit comprising the programmable logic hardware and the exclusive-use hardware, which are designed by the method of designing the information processing system as claimed in claim 13.

* * * * *